US012575318B2

(12) United States Patent
Hong et al.

(10) Patent No.: US 12,575,318 B2
(45) Date of Patent: Mar. 10, 2026

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Tae-Ryang Hong, Paju-si (KR); Jun-Yun Kim, Paju-si (KR); Jeong-Eun Baek, Paju-si (KR); Ji-Ae Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 561 days.

(21) Appl. No.: 17/034,380

(22) Filed: Sep. 28, 2020

(65) Prior Publication Data

US 2021/0119141 A1 Apr. 22, 2021

(30) Foreign Application Priority Data

Oct. 18, 2019 (KR) ........................ 10-2019-0130135

(51) Int. Cl.

*H10K 85/60* (2023.01)
*H10K 50/11* (2023.01)
*H10K 101/40* (2023.01)

(52) U.S. Cl.

CPC ........... *H10K 85/624* (2023.02); *H10K 50/11* (2023.02); *H10K 85/654* (2023.02); *H10K 85/6572* (2023.02); *H10K 2101/40* (2023.02)

(58) Field of Classification Search

CPC ...... H10K 50/11; H10K 50/13; H10K 85/624; H10K 85/654; H10K 85/656; H10K 85/657; H10K 85/6572; H10K 2101/30; H10K 2101/40; H10K 50/12; H01L 51/0056; H01L 51/0067; H01L 51/0071; H01L 51/0072

See application file for complete search history.

(56) References Cited

U.S. PATENT DOCUMENTS 7,175,922 B2 2/2007 Jarikov et al.
2003/0189401 A1* 10/2003 Kido ...................... H10K 50/17 313/506
2003/0224202 A1* 12/2003 Brown ................. H10K 85/657 313/506

(Continued)

FOREIGN PATENT DOCUMENTS

CN 109817836 A 5/2019
CN 109994628 A 7/2019

(Continued)

OTHER PUBLICATIONS

WO-2018173598-A1 machine translation (Year: 2018).*

(Continued)

*Primary Examiner* — Elizabeth M. Dahlburg
(74) *Attorney, Agent, or Firm* — Morgan, Lewis & Bockius LLP

(57) ABSTRACT

An organic light emitting diode including a first electrode; a second electrode facing the first electrode; and an emitting material layer including a first compound and a second compound and positioned between the first and second electrodes. An energy level of the first compound and an energy level of the second compound satisfy a pre-determined condition. An organic light emitting device may include the organic light emitting diode.

14 Claims, 5 Drawing Sheets

D1

(56) References Cited

U.S. PATENT DOCUMENTS

| | | | | |
|---|---|---|---|---|
| 2012/0299806 | A1* | 11/2012 | Nishide | H10K 85/624 257/E51.026 |
| 2016/0190478 | A1* | 6/2016 | Nakanotani | C09K 11/06 257/40 |
| 2019/0386235 | A1 | 12/2019 | Duan et al. | |
| 2020/0083460 | A1 | 3/2020 | Duan et al. | |

FOREIGN PATENT DOCUMENTS

| | | | |
|---|---|---|---|
| JP | 2003347057 | A | 12/2003 |
| WO | WO-2018173598 | A1 * | 9/2018 |
| WO | 2019128104 | A1 | 7/2019 |

OTHER PUBLICATIONS

Chem. Commun., 2015, 51, 13662-13665 (Year: 2015).*
Lee et al., Adv. Mater. 2015, 27, 5861-5867 (Year: 2015).*
Office Action issued in corresponding German Patent Application No. 10-2020-124417.7, dated Mar. 17, 2021.
Office Action dated Aug. 25, 2023 for corresponding Chinese Patent Application No. 202010986793.4 (See English Translation).
Office Action issued in corresponding German Patent Application No. 102020124417.7, dated Oct. 20, 2023.
Office Action issued in corresponding Korean Intellectual Property Application No. 10-2019-0130135, dated Apr. 26, 2024 Note: WO2018/173598 cited therein is already of record.

* cited by examiner

ORGANIC LIGHT EMITTING DIODE AND ORGANIC LIGHT EMITTING DEVICE INCLUDING THE SAME

CROSS-REFERENCE TO RELATED APPLICATIONS

The present application claims the benefit of Korean Patent Application No. 10-2019-0130135 filed in the Republic of Korea on Oct. 18, 2019, which is hereby incorporated by reference in its entirety.

BACKGROUND

Technical Field

The present disclosure relates to an organic light emitting diode, and more particularly, to an organic light emitting diode having excellent emitting property and an organic light emitting device including the organic light emitting diode.

Discussion of the Related Art

Recently, requirement for flat panel display devices having small occupied area is increased. Among the flat panel display devices, a technology of an organic light emitting display device, which includes an organic light emitting diode (OLED) and may be called to as an organic electroluminescent device, is rapidly developed.

The OLED emits light by injecting electrons from a cathode as an electron injection electrode and holes from an anode as a hole injection electrode into an emitting material layer, combining the electrons with the holes, generating an exciton, and transforming the exciton from an excited state to a ground state. In the fluorescent material, only singlet exciton is involved in the emission such that the related art fluorescent material has low emitting efficiency. In the phosphorescent material, both the singlet exciton and the triplet exciton are involved in the emission such that the phosphorescent material has higher emitting efficiency than the fluorescent material. However, the metal complex compound, which is a typical phosphorescent material, has a short emitting lifespan and thus has a limitation in commercialization.

SUMMARY

The present disclosure is directed to an OLED and an organic light emitting device that substantially obviate one or more of the problems associated with the limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structures pointed out in the written description, or derivable therefrom, and the claims hereof as well as in the appended drawings.

To achieve these and other aspects of the inventive concepts, as embodied and broadly described herein, an organic light emitting diode comprises a first electrode; a second electrode facing the first electrode; and an emitting material layer including a first compound and a second compound and positioned between the first and second electrodes, wherein the first compound is represented by Formula 1:

[Formula 1]

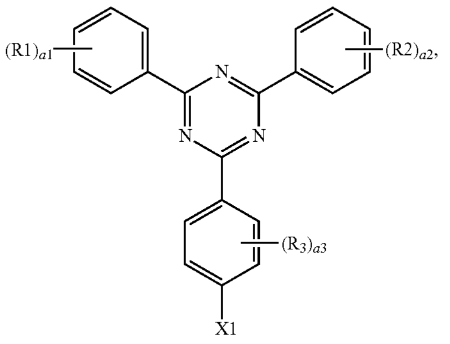

wherein each of a1 to a3 is independently an integer of 0 to 4, wherein each of R1 to R3 is independently selected from the group consisting of deuterium, tritium, a C1 to C20 alkyl, a C6 to C30 aryl and a C3 to C40 heteroaryl, or adjacent two of R1, adjacent two of R2 and/or adjacent two of R3 are combined to form a fused ring, wherein X1 is a heteroaryl including at least two of carbon (C), nitrogen (N), oxygen (O) and sulfur (S), wherein the second compound is represented by Formula 2:

[Formula 2]

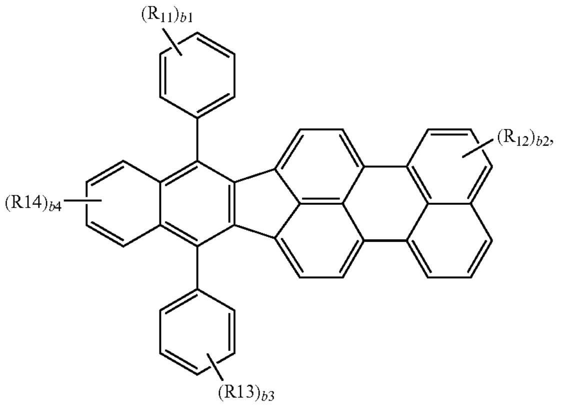

wherein each of b1 and b3 is independently an integer of 0 to 5, and b2 is an integer of 0 to 3, wherein b4 is an integer of 0 to 4, and wherein each of R11 to R14 is selected from the group consisting of deuterium, tritium, a C1 to C20 alkyl, a C6 to C30 aryl and a C3 to C40 heteroaryl, or adjacent two of R11, adjacent two of R12, adjacent two of R13 and/or adjacent two of R14 are combined to form a fused ring.

In another aspect, an organic light emitting device comprises a substrate; an organic light emitting diode disposed on or over the substrate, the organic light emitting diode including: a first electrode; a second electrode facing the first electrode; and an emitting material layer including a first compound and a second compound and positioned between the first and second electrodes, wherein the first compound is represented by Formula 1:

[Formula 1]

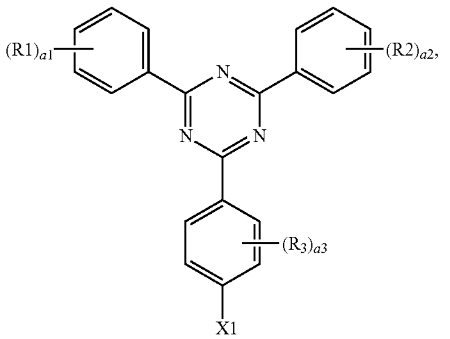

wherein each of a1 to a3 is independently an integer of 0 to 4, wherein each of R1 to R3 is independently selected from the group consisting of deuterium, tritium, a C1 to C20 alkyl, a C6 to C30 aryl and a C3 to C40 heteroaryl, or adjacent two of R1, adjacent two of R2 and/or adjacent two of R3 are combined to form a fused ring, wherein X1 is a heteroaryl including at least two of carbon (C), nitrogen (N), oxygen (O) and sulfur (S), wherein the second compound is represented by Formula 2:

[Formula 2]

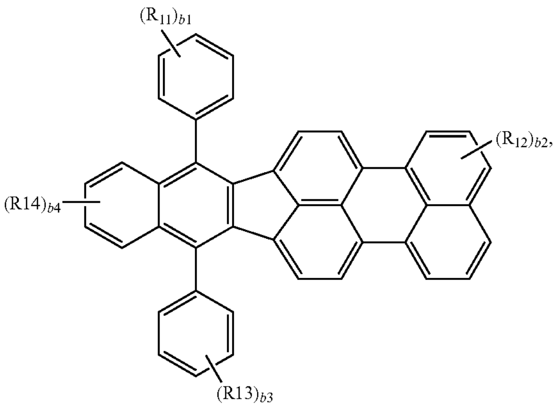

wherein each of b1 and b3 is independently an integer of 0 to 5, and b2 is an integer of 0 to 3, wherein b4 is an integer of 0 to 4, and wherein each of R11 to R14 is selected from the group consisting of deuterium, tritium, a C1 to C20 alkyl, a C6 to C30 aryl and a C3 to C40 heteroaryl, or adjacent two of R11, adjacent two of R12, adjacent two of R13 and/or adjacent two of R14 are combined to form a fused ring.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain principles of the present disclosure.

DETAILED DESCRIPTION

Reference will now be made in detail to some of the examples and preferred embodiments, which are illustrated in the accompanying drawings.

The present disclosure relates to an OLED, in which a delayed fluorescent material and a fluorescent material in a single emitting material layer or adjacent emitting material layers, and an organic light emitting device including the OLED. For example, the organic light emitting device may be an organic light emitting display device or an organic lightening device. As an example, an organic light emitting display device, which is a display device including the OLED of the present disclosure, will be mainly described.

Figure 1:
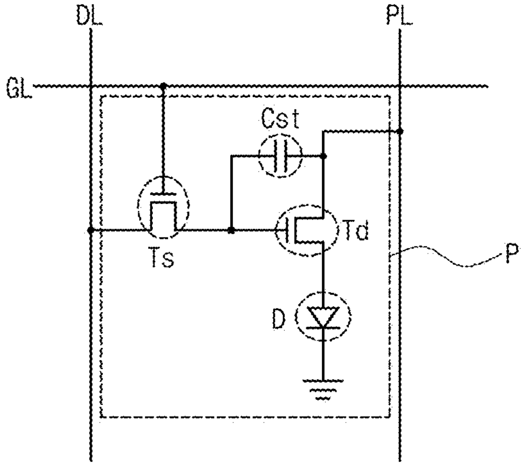
FIG. 1 is a schematic circuit diagram of an organic light emitting display device of the present disclosure.

FIG. 1 is a schematic circuit diagram of an organic light emitting display device of the present disclosure.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region may include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
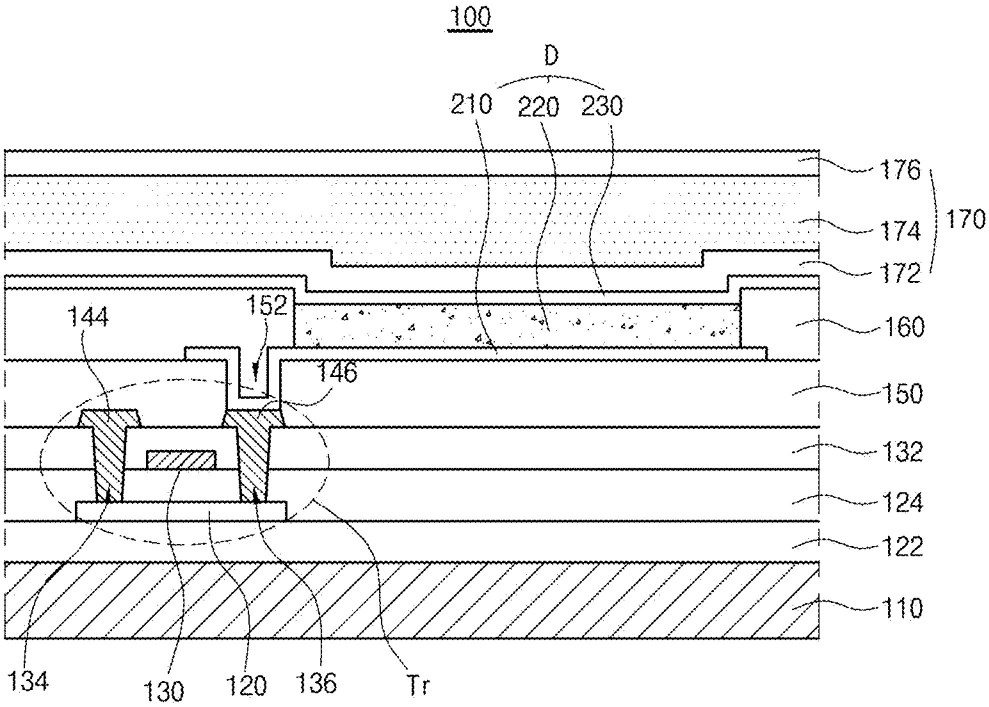
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, the organic light emitting display device 100 includes a substrate 110, a TFT Tr and an OLED D connected to the TFT Tr.

The substrate 110 may be a glass substrate or a plastic substrate. For example, the substrate 110 may be a polyimide substrate.

A buffer layer 122 is formed on the substrate, and the TFT Tr is formed on the buffer layer 122. The buffer layer 122 may be omitted.

A semiconductor layer 120 is formed on the buffer layer 122. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 124 is formed on the semiconductor layer 120. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132.

The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element. In addition, the power line, which may be formed to be parallel to and spaced apart from one of the gate and data lines, and the storage capacitor for maintaining the voltage of the gate electrode of the TFT Tr in one frame may be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 210, which is connected to the drain electrode 146 of the TFT Tr, an light emitting layer 220 and a second electrode 230. The light emitting layer 220 and the second electrode 230 are sequentially stacked on the first electrode 210. The OLED D is positioned in each of the red, green and blue pixel regions and respectively emits the red, green and blue light.

The first electrode 210 is separately formed in each pixel region. The first electrode 210 may be an anode and may be formed of a conductive material, e.g., a transparent conductive oxide (TCO), having a relatively high work function. For example, the first electrode 210 may be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 of the present disclosure is operated in a top-emission type, a reflection electrode or a reflection layer may be formed under the first electrode 210. For example, the reflection electrode or the reflection layer may be formed of aluminum-palladium-copper (APC) alloy.

In addition, a bank layer 160 is formed on the planarization layer 150 to cover an edge of the first electrode 210. Namely, the bank layer 160 is positioned at a boundary of the pixel region and exposes a center of the first electrode 210 in the pixel region.

The light emitting layer 220 as an emitting unit is formed on the first electrode 210. The light emitting layer 220 may have a single-layered structure of an emitting material layer (EML) including an emitting material. To increase an emitting efficiency of the organic light emitting display device, the light emitting layer 220 may have a multi-layered structure. For example, the light emitting layer 220 may further include a hole injection layer (HIL), a hole transporting layer (HTL), an electron blocking layer (EBL), a hole blocking layer (HBL), an electron transporting layer (ETL) and an electron injection layer (EIL). The HIL, the HTL and the EBL are sequentially disposed between the first electrode (210) and the EML, and the HBL, the ETL and the EIL are sequentially disposed between the EML and the second electrode 230. In addition, the EML may has a single-layered structure or a multi-layered structure. Moreover, two or more light emitting layers may be disposed to be spaced apart from each other such that the OLED D may have a tandem structure.

The second electrode 230 is formed over the substrate 110 where the light emitting layer 220 is formed. The second electrode 230 covers an entire surface of the display area and may be formed of a conductive material having a relatively low work function to serve as a cathode. For example, the second electrode 230 may be formed of aluminum (Al), magnesium (Mg), calcium (Ca), silver (Ag) or their alloy or combination.

Although not shown, the organic light emitting display device 100 may include a color filter corresponding to the red, green and blue pixel regions. For example, when the OLED D, which has the tandem structure and emits the white light, is formed to all of the red, green and blue pixel regions, a red color filter pattern, a green color filter pattern and a blue color filter pattern may be formed in the red, green and blue pixel regions, respectively, such that a full-color display is provided.

When the organic light emitting display device 100 is operated in a bottom-emission type, the color filter may be disposed between the OLED D and the substrate 110, e.g., between the interlayer insulating layer 132 and the planarization layer 150. Alternatively, the organic light emitting display device 100 is operated in a top-emission type, the color filter may be disposed over the OLED D, e.g., over the second electrode 230.

An encapsulation film 170 is formed on the second electrode 230 to prevent penetration of moisture into the OLED D. The encapsulation film 170 includes a first inorganic insulating layer 172, an organic insulating layer 174 and a second inorganic insulating layer 176 sequentially stacked, but it is not limited thereto.

A polarization plate (not shown) for reducing an ambient light reflection may be disposed over the top-emission type OLED D. For example, the polarization plate may be a circular polarization plate.

In addition, a cover window (not shown) may be attached to the encapsulation film 170 or the polarization plate. In this instance, the substrate 110 and the cover window have a flexible property such that a flexible organic light emitting display device may be provided.

Figure 3:
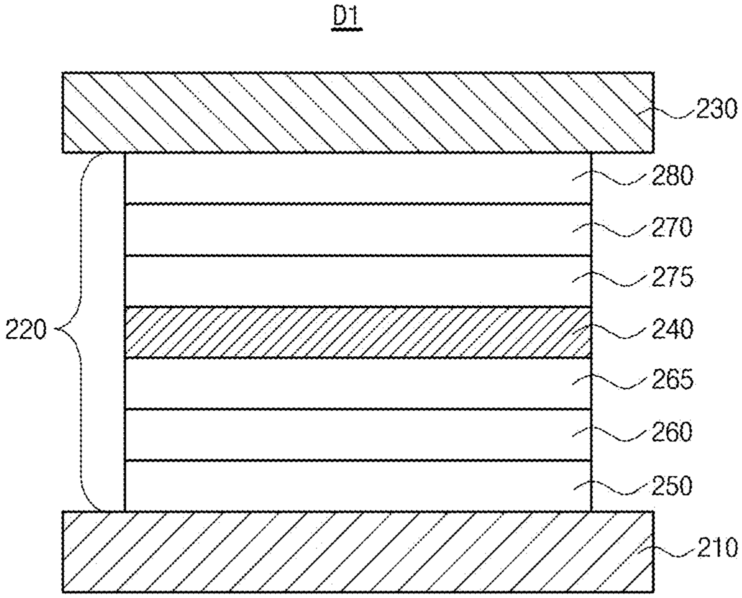
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes the first and second electrodes 210 and 230, which face each other, and the light emitting layer 220 therebetween. The light emitting layer 220 includes an emitting material layer (EML) 240.

The first electrode 210 may be anode, and the second electrode 230 may be a cathode.

The light emitting layer 220 further include at least one of a hole transporting layer (HTL) 260 between the first electrode 210 and the EML 240 and an electron transporting layer (ETL) 270 between the second electrode 230 and the EML 240.

In addition, the light emitting layer 220 may further include at least one of a hole injection layer (HIL) 250 between the first electrode 210 and the HTL 260 and an electron injection layer (EIL) 280 between the second electrode 230 and the ETL 270.*t*

Moreover, the light emitting layer 220 may further include at least one of an electron blocking layer (EBL) 265 between the HTL 260 and the EML 240 and a hole blocking layer (HBL) 275 between the EML 240 and the ETL 270.

The EML 240 include a first compound of a delayed fluorescent material (compound) and a second compound of a fluorescent material (compound). The EML may further include a third compound as a host.

For example, the third compound as the host may be one of 9-(3-(9H-carbazol-9-yl)phenyl)-9H-carbazole-3-carbonitrile (mCP-CN), CBP, 3,3'-bis(N-carbazolyl)-1,1'-biphenyl (mCBP), 1,3-bis(carbazol-9-yl)benzene (mCP), oxybis(2,1-phenylene))bis(diphenylphosphine oxide (DPEPO), 2,8-bis (diphenylphosphoryl)dibenzothiophene (PPT), 1,3,5-tri[(3-pyridyl)-phen-3-yl]benzene (TmPyPB), 2,6-di(9H-carbazol-9-yl)pyridine (PYD-2Cz), 2,8-di(9H-carbazol-9-yl) dibenzothiophene (DCzDBT), 3',5'-di(carbazol-9-yl)-[1,1'-bipheyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene), 9-(4-(9H-carbazol-9-yl)phenyl)-9H-3,9'-bicarbazole, 9-(3-(9H-carbazol-9-yl)phenyl)-9H-3,9'-bicarbazole, or 9-(6-(9H-carbazol-9-yl)pyridin-3-yl)-9H-3,9'-bicabazole, but it is not limited thereto.

The delayed fluorescent material as the first compound in the EML 240 is represented by Formula 1.

[Formula 1]

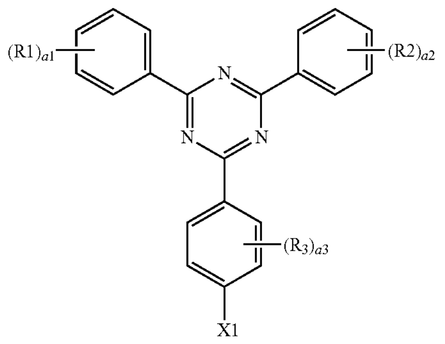

In Formula 1, each of a1 to a3 is independently an integer of 0 to 4. Each of R1 to R3 is independently selected from the group consisting of deuterium, tritium, a C1 to C20 alkyl, a C6 to C30 aryl and a C3 to C40 heteroaryl, or adjacent two of R1, adjacent two of R2 and/or adjacent two of R3 are combined (or bonded) to form a fused ring. The fused ring may be a C6-C20 fused alicyclic ring, a C4-C20 fused heteroalicyclic ring, a C6-C20 fused aromatic ring or a C4-C20 fused heteroaromatic ring.

X1 is a heteroaryl including at least two of carbon (C), nitrogen (N), oxygen (O) and sulfur (S). For example, X1 may be a heteroaryl including C and at least one of N, O and S.

In this instance, alkyl, aryl and heteroaryl is substituted or non-substituted, and the substituent may be a C1 to C20 alkyl, a C6 to C30 aryl or a C3 to C40 heteroaryl.

For example, the first compound may be represented by Formula 2.

[Formula 2]

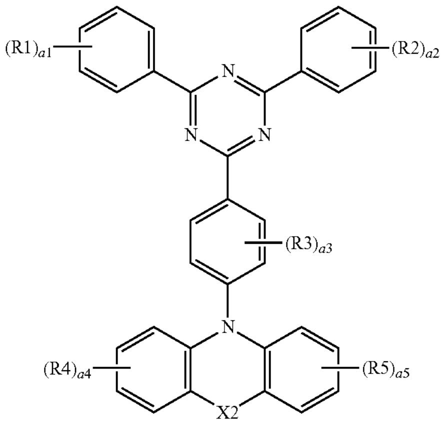

In Formula 2, each of a1 to a5 is independently an integer of 0 to 4. Each of R1 to R5 is independently selected from the group consisting of deuterium, tritium, a C1 to C20 alkyl, a C6 to C30 aryl and a C3 to C40 heteroaryl, or adjacent two of R1, adjacent two of R2, adjacent two of R3 and/or adjacent two of R4 are combined (or bonded) to form a fused ring. X2 is selected from a single bond, CR6R7, O and S, and each of R6 and R7 is independently selected from hydrogen, deuterium, tritium, a C1 to C20 alkyl and a C6 to C30 aryl.

For example, a1, a2 and a5 may be 0, a3 is 0 or 2, and a4 is 2. R3 may be substituted or non-substituted carbazole, and adjacent two of R4 may be combined to form the fused ring. In this instance, the fused ring may be a C6-C20 fused alicyclic ring, a C4-C20 fused heteroalicyclic ring, a C6-C20 fused aromatic ring or a C4-C20 fused heteroaromatic ring.

The first compound may be one of compounds of Formula 3.

[Formula 3]

1-1

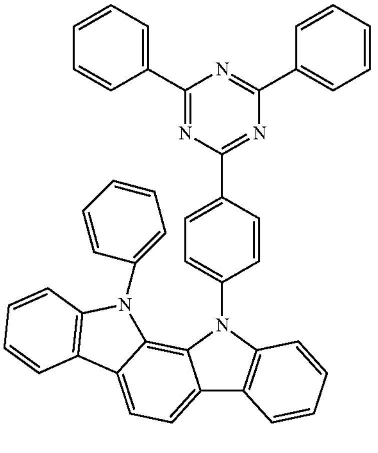

-continued 1-2

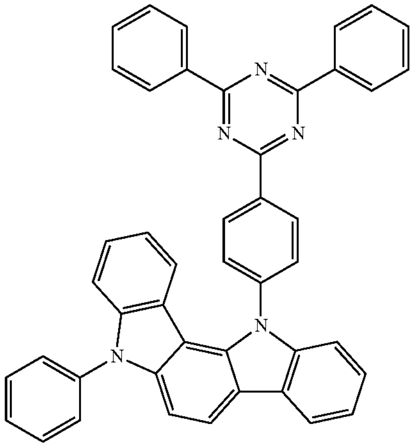

1-3

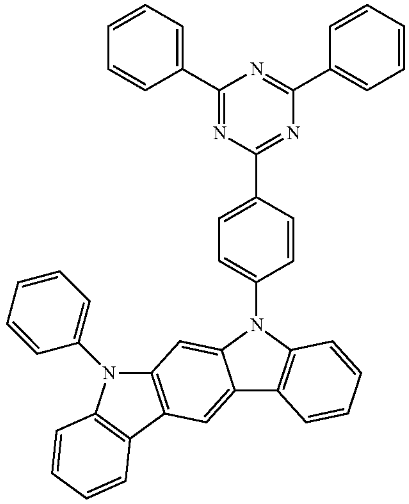

1-4

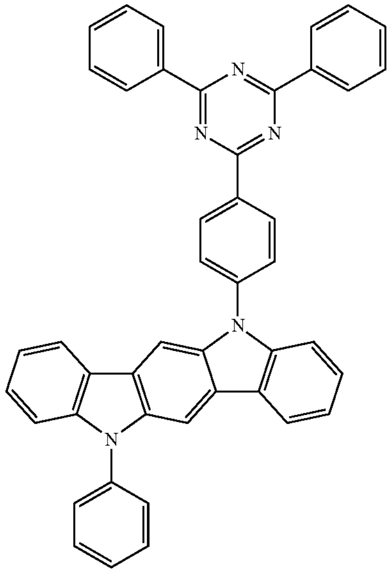

-continued
1-5
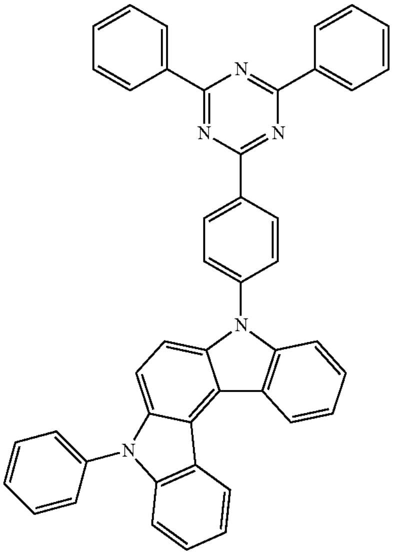
1-6
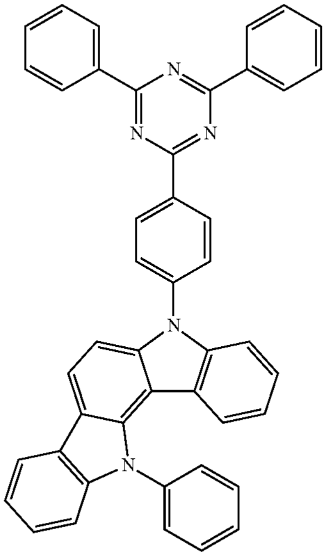
1-7
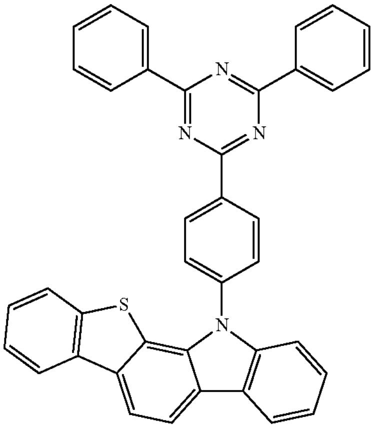
-continued
1-8
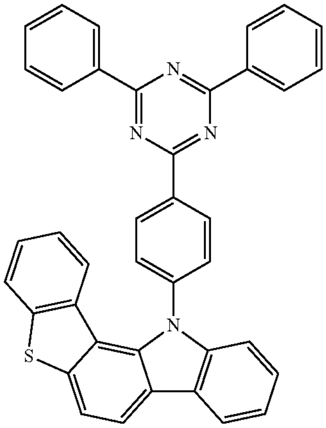
1-9
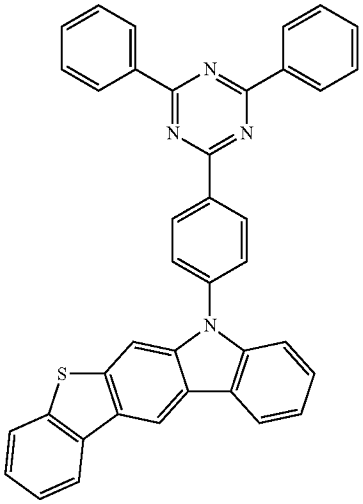
1-10
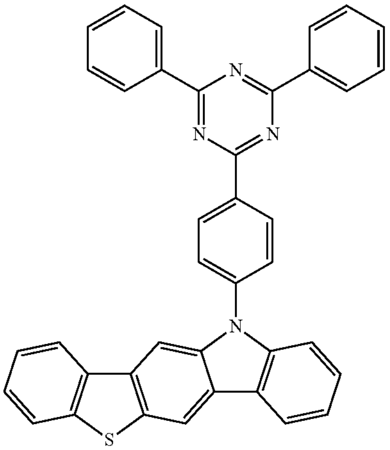

-continued
1-11
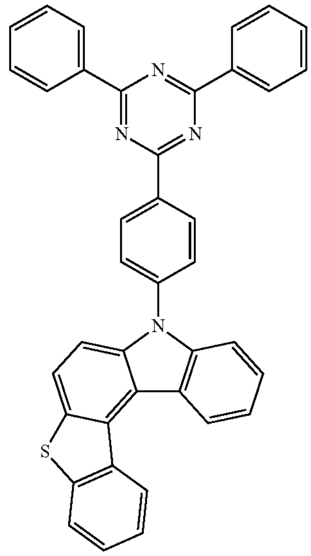
1-12
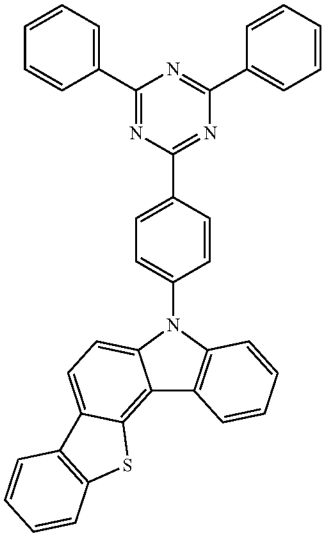
1-13
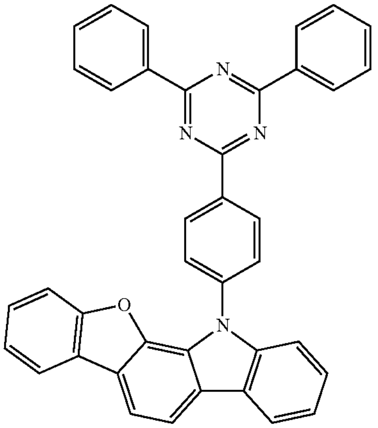
-continued
1-14
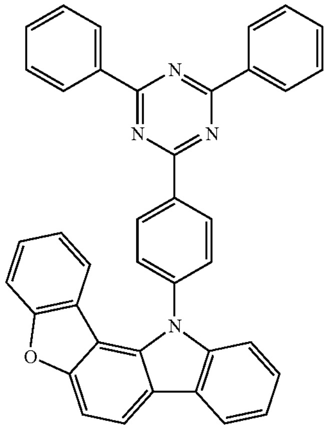
1-15
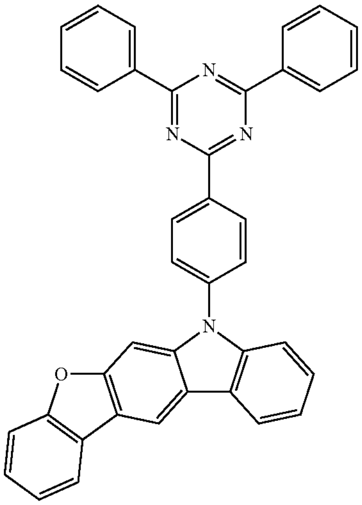
1-16
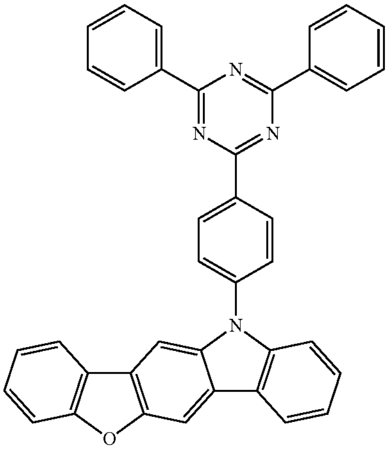

1-17
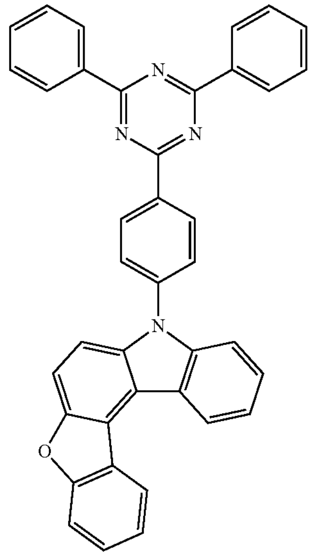
1-18
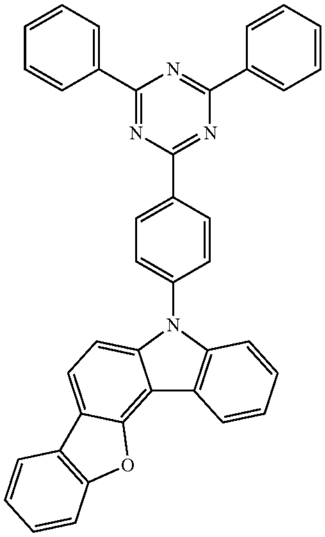
1-19
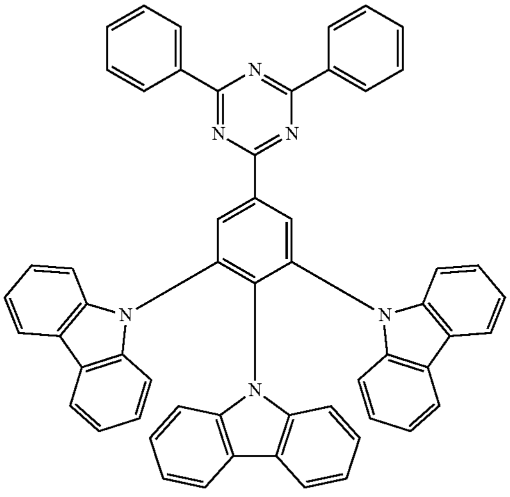
1-20
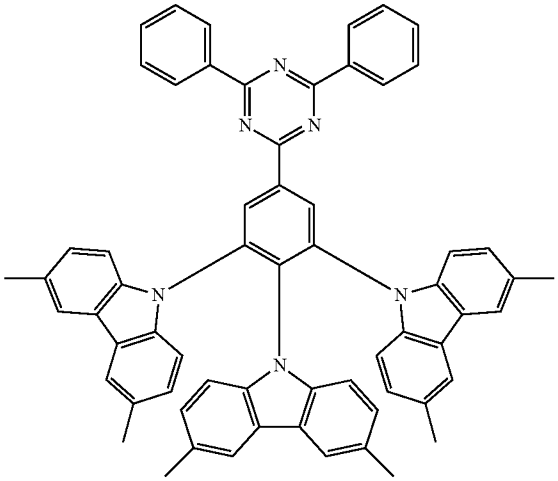
1-21
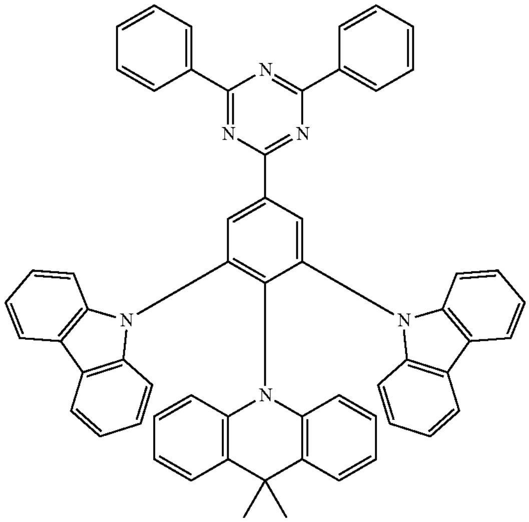
1-22
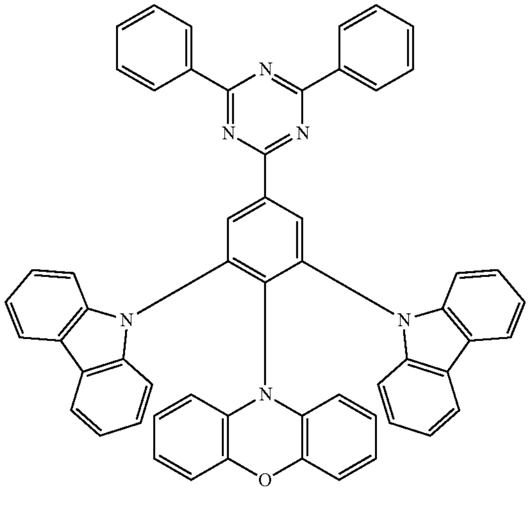

-continued 1-23

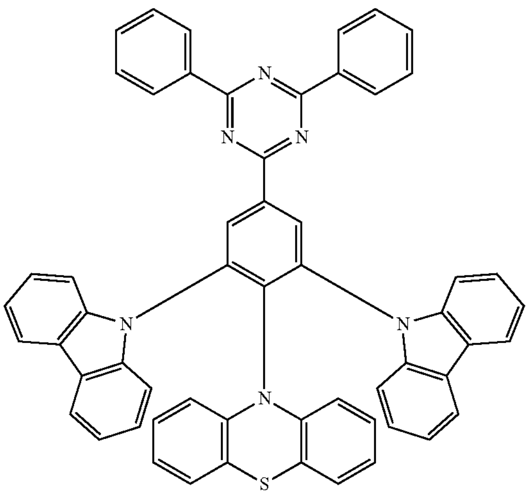

1-24

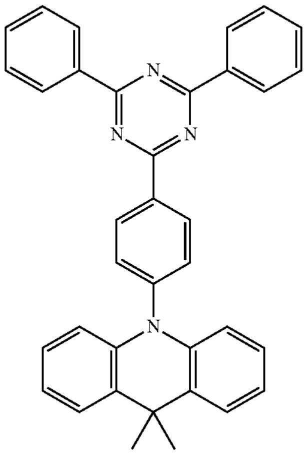

1-25

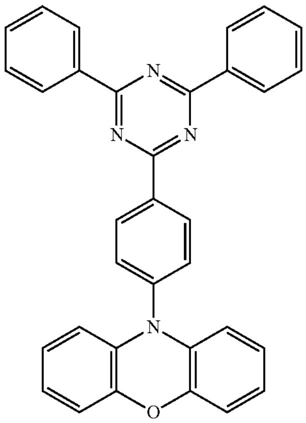

-continued 1-26

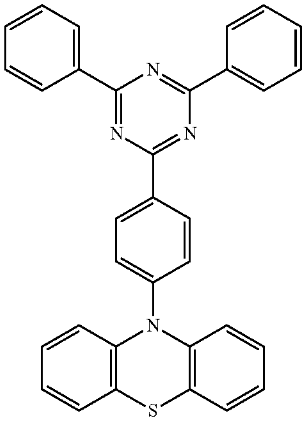

A difference between a singlet energy level and a triplet energy level of the delayed fluorescent material is very small (is less than about 0.3 eV).

The energy of the triplet exciton of the delayed fluorescent material is converted into the singlet exciton by a reverse intersystem crossing (RISC) such that the delayed fluorescent material has high quantum efficiency. However, since the delayed fluorescent material has wide full width at half maximum (FWHM), the delayed fluorescent material has a disadvantage in a color purity.

To overcome the problem of the color purity of the delayed fluorescent material, the EML 240 further include the second compound of the fluorescent material to provide a hyper fluorescence.

The second compound of the fluorescent material is represented by Formula 4.

[Formula 4]

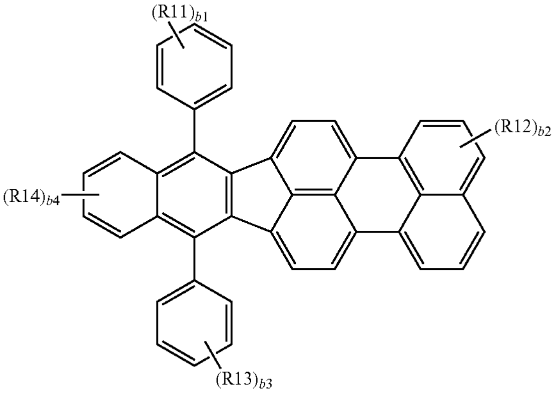

In Formula 4, each of b1 and b3 is independently an integer of 0 to 5, b2 is an integer of 0 to 3, and b4 is an integer of 0 to 4. Each of R11 to R14 is selected from the group consisting of deuterium, tritium, a C1 to C20 alkyl, a C6 to C30 aryl and a C3 to C40 heteroaryl, or adjacent two of R11, adjacent two of R12, adjacent two of R13 and/or adjacent two of R14 are combined (or bonded) to form a fused ring. The fused ring may be a C6-C20 fused alicyclic ring, a C4-C20 fused heteroalicyclic ring, a C6-C20 fused aromatic ring or a C4-C20 fused heteroaromatic ring.

In this instance, alkyl, aryl and heteroaryl is substituted or non-substituted, and the substituent may be a C1 to C20 alkyl, a C6 to C30 aryl or a C3 to C40 heteroaryl.

For example, each of b1 and b3 may be an integer of 0 to 2, b2 may be 0 or 1, and b4 may be 0. Each of R11 to R13 may be independently selected from the group consisting of t-butyl, phenyl and t-butylphenyl.
The second compound may be one of compounds of Formula 5.
[Formula 5]
2-1
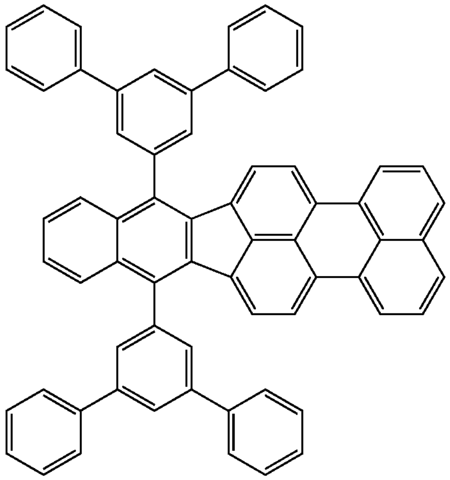
2-2
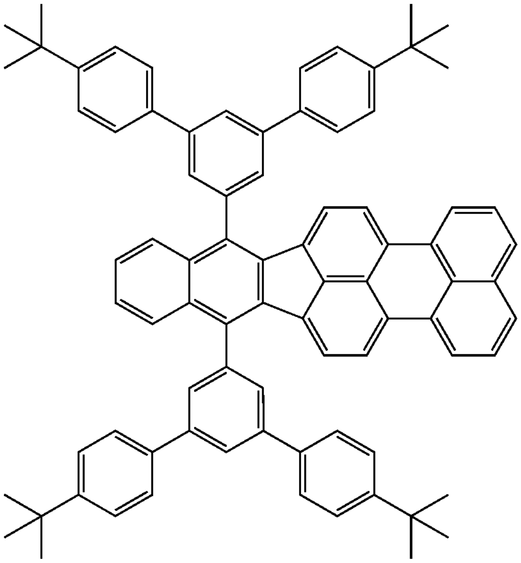
-continued
2-3
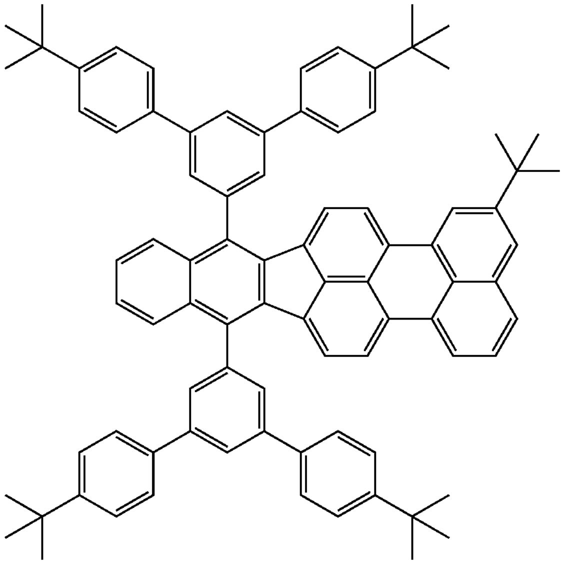
2-4
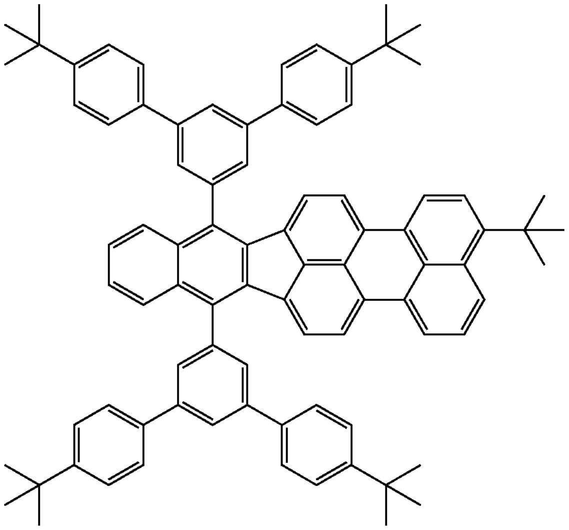
2-5
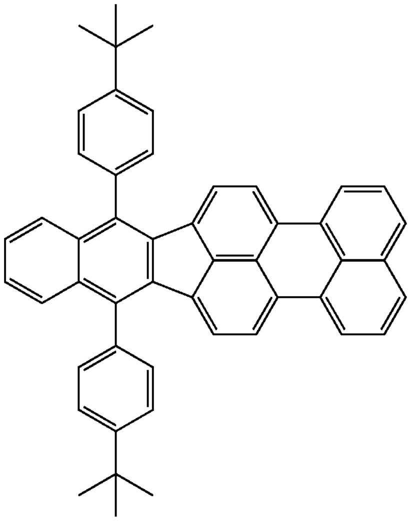

-continued
2-6
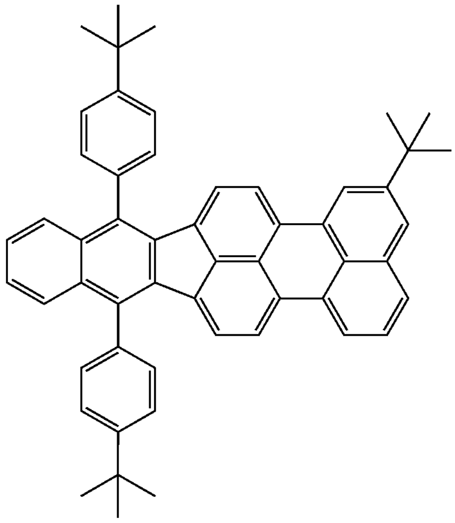
2-7
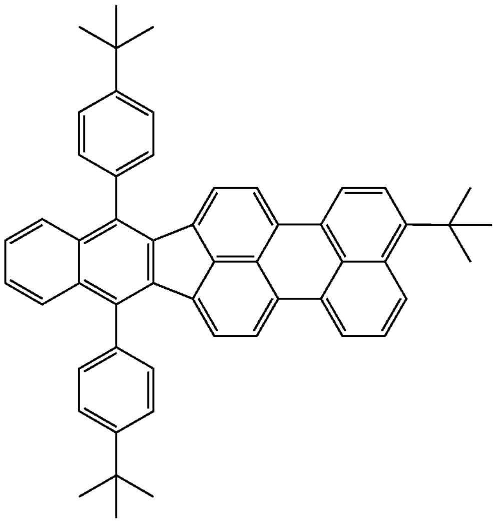
2-8
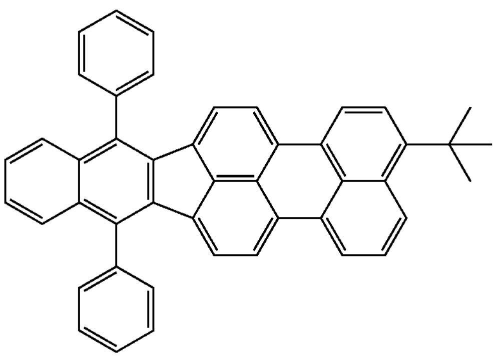
-continued
2-9
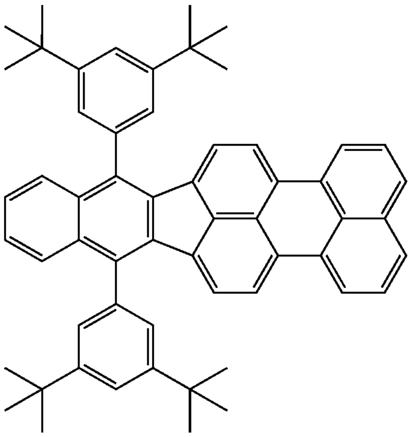
2-10
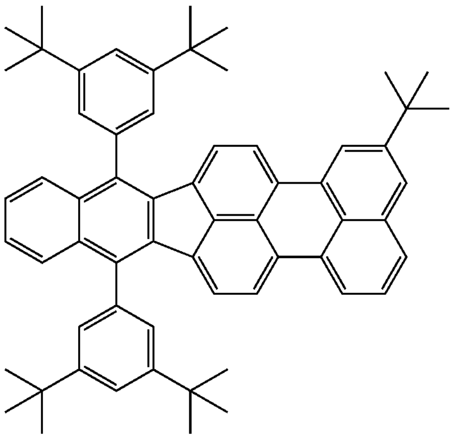
2-11
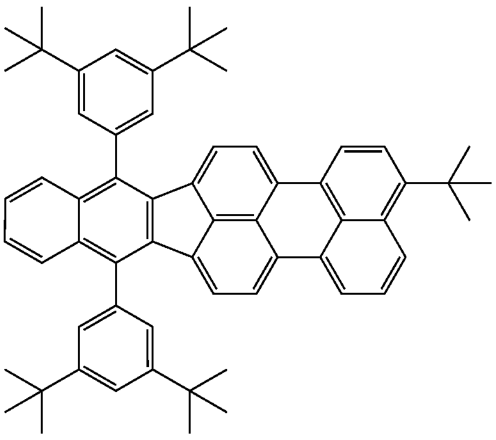

-continued
2-12
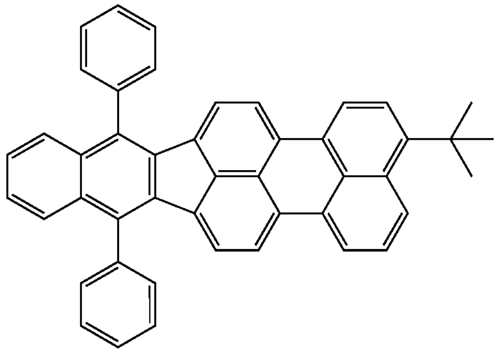
2-13
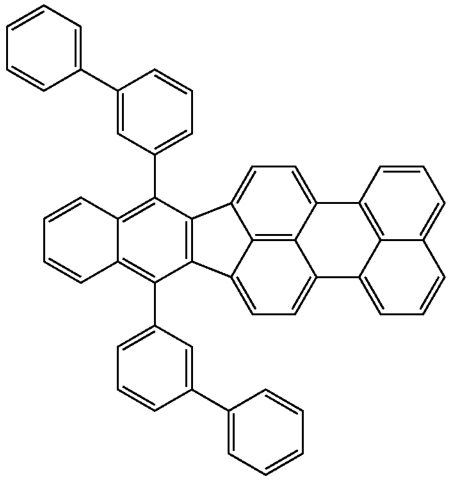
2-14
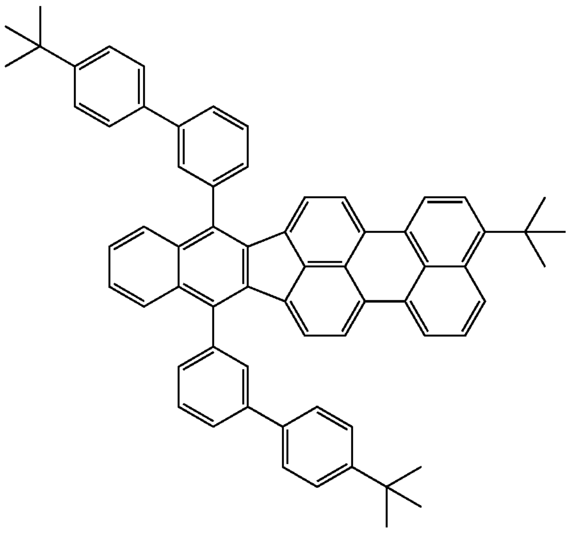
-continued
2-15
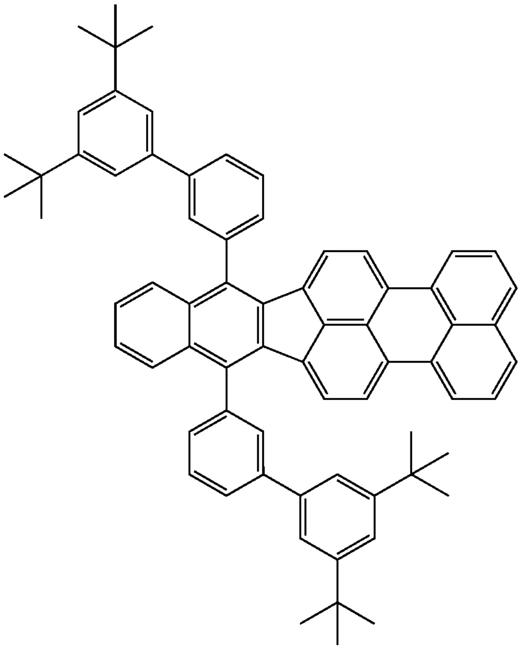
2-16
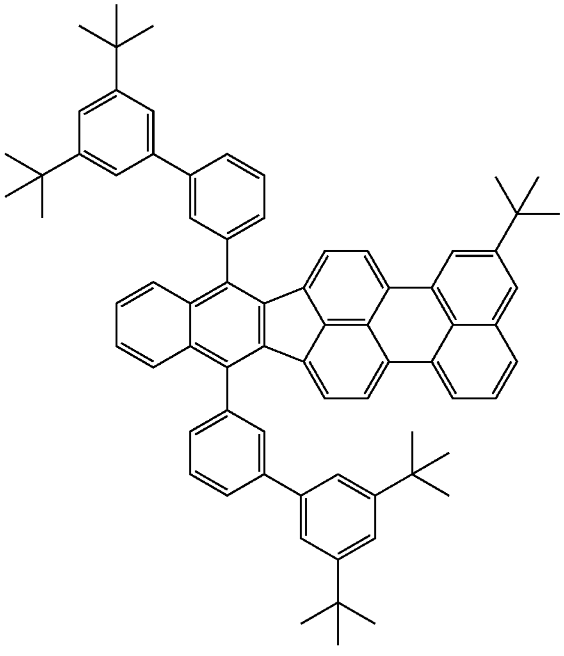

-continued 2-17

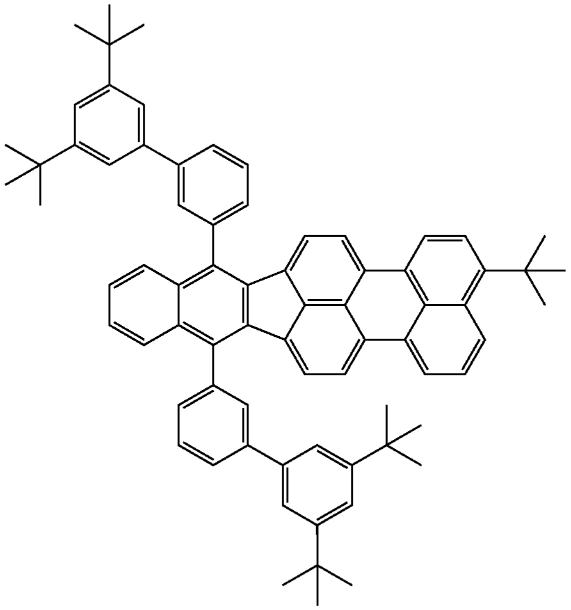

2-18

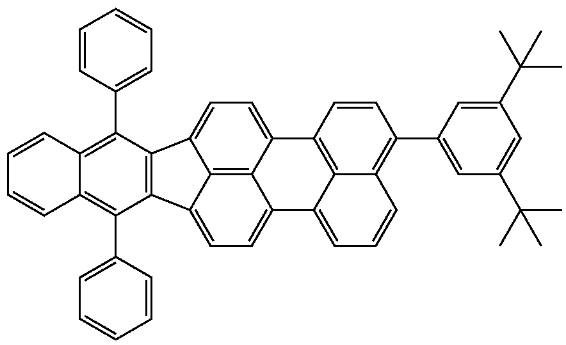

The EML 240 in the OLED D of the present disclosure includes the first compound and the second compound, and the exciton of the first compound is transported into the second compound. As a result, the OLED D provide the emission with narrow FWHM and high emitting efficiency.

In the OLED D of the present disclosure, an energy level of the first compound and an energy level of the second compound satisfy a pre-determined condition such that the transporting efficiency of the exciton from the first compound into the second compound is increased. Accordingly, the emitting efficiency and the color purity of the OLED D and the organic light emitting display device are improved.

In addition, the energy level of the first compound, the energy level of the second compound and an energy level of the third compound satisfy a pre-determined condition such that the emitting efficiency and the color purity of the OLED D and the organic light emitting display device may be further improved.

Figure 4A:
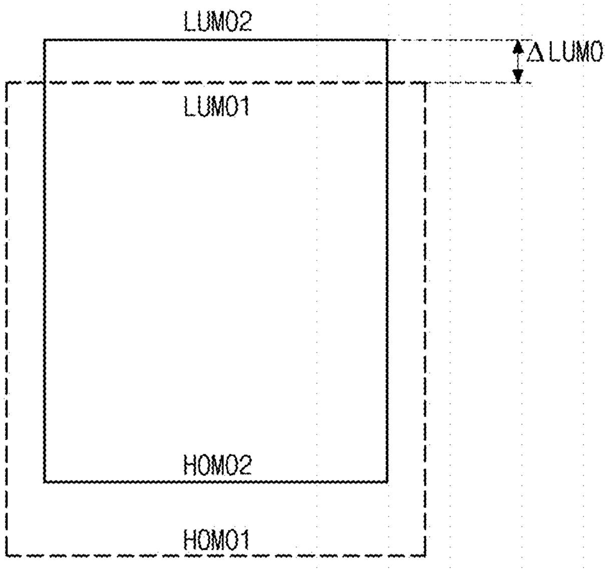
FIGS. 4A and 4B are schematic views illustrating an energy level relation of a first compound and a second compound in the OLED.

Referring to FIG. 4A, which is a schematic view illustrating an energy level relation of a first compound and a second compound in the OLED of the present disclosure, a lowest unoccupied molecular orbital (LUMO) energy level "LUMO1" of the first compound is equal to or lower than a LUMO energy level "LUMO2" of the second compound, and a difference "ΔLUMO" between the LUMO energy level "LUMO1" of the first compound and the LUMO energy level "LUMO2" of the second compound is about 0.1 eV or less. ($\Delta LUMO(=LUMO1-LUMO2)\leq 0.1$ eV)

In addition, a highest occupied molecular orbital (HOMO) energy level "HOMO1" of the first compound is equal to or lower than a HOMO energy level "HOMO2" of the second compound.

Namely, an energy level of the first compound as the delayed fluorescent compound and an energy level of the second compound as the fluorescent compound are matched, the charge is rapidly transferred into the second compound as an emitter. As a result, a recombination zone is present in a center of the EML such that the driving voltage of the OLED is decreased, and the emitting efficiency of the OLED is increased.

Moreover, an energy band gap of the first compound may be about 2.0 to 3.0 eV and may be greater than that of the second compound. For example, the energy band gap of the first compound may be about 2.8 to 3.0 eV.

As mentioned above, the first compound of the delayed fluorescent material uses the singlet exciton energy and the triplet exciton energy for emission. Accordingly, in the EML 240 including the first and second compounds, the energy of the first compound is transported into the second compound, and the light is emitted from the second compound. As a result, the emitting efficiency and the color purity of the OLED are improved.

Figure 4B:
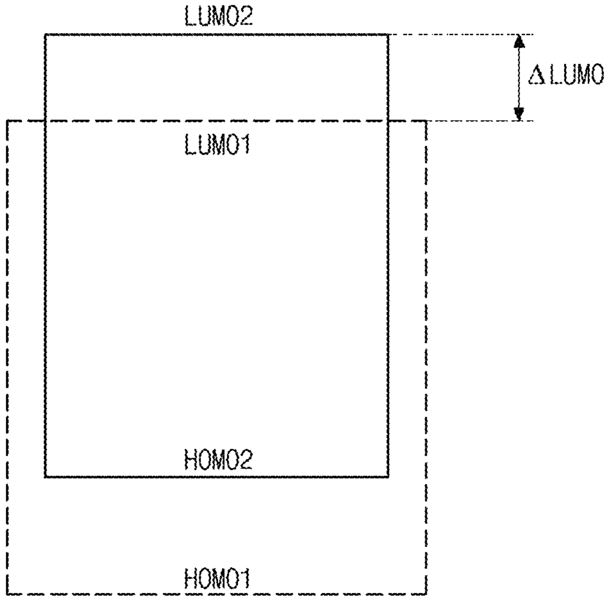

On the other hand, if a delayed fluorescent material and a fluorescent material in the EML do not satisfy the above energy level relation, there is a limitation in the emitting efficiency and/or the color purity. Namely, referring to FIG. 4B, when a difference "ΔLUMO" between the LUMO energy level "LUMO1" of the delayed fluorescent material and the LUMO energy level "LUMO2" of the fluorescent material is greater than 0.1 eV, the exciton generated in the host is not transported into the delayed fluorescent material and is transported into the fluorescent material. Accordingly, the triplet energy of the fluorescent material is not involved in the emission such that the emission efficiency of the OLED is decreased.

In the EML 240, the singlet energy level of the first compound is smaller than that of the third compound as the host and greater than that of the second compound. In addition, the triplet energy level of the first compound is smaller than that of the third compound as the host and greater than that of the second compound.

Moreover, the HOMO energy level of the third compound is lower than that of each of the first and second compounds, and the LUMO energy level of the third compound is higher than that of each of the first and second compounds. For example, a difference between the HOMO energy level of the third compound and the HOMO energy level of the first compound or a difference between the LUMO energy level of the third compound and the LUMO energy level of the first compound may be about 0.5 eV or less, e.g., about 0.1 to 0.5 eV. When this condition is satisfied, the charge transfer efficiency from the third compound into the first compound is improved such that the emitting efficiency of the OLED is improved.

In the EML 240, a weight ratio (weight %) of the first compound may be greater than that of the second compound and may be smaller than that of the third compound. When the weight ratio of the first compound is greater than that of the second compound, the energy of the first compound is sufficiently transferred into the second compound. For example, in the EML 240, the first compound may have a weight % of about 20 to 40, the second compound may have a weight % of about 0.1 to 5, and the third compound may have a weight % of about 60 to 75. However, it is not limited thereto.

Figure 5:
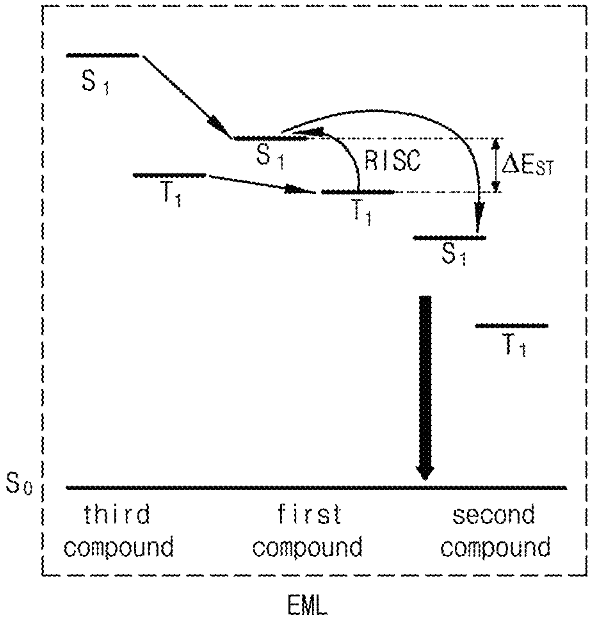
FIG. 5 is a view illustrating an emission mechanism of an OLED according to the second embodiment of the present disclosure.

Referring to FIG. 5, which is a view illustrating an emission mechanism of an OLED according to the second embodiment of the present disclosure, the single level "S1" and the triplet level "T1" generated in the third compound as a host is respectively transferred into the singlet energy "S1" and the triplet level "T1" of the first compound as a delayed fluorescent material. Since a difference between the singlet energy level of the first compound and the triplet energy level of the first compound is relatively small, the triplet energy level "T1" of the first compound is converted into the singlet energy level "S1" of the first compound by the RISC. For example, the difference ($\Delta E_{ST}$) between the singlet energy level of the first compound and the triplet energy level of the first compound may be about 0.3 eV or less. Then, the singlet energy level "S1" of the first compound is transferred into the singlet energy level "S1" of the second compound such that the second compound provide the emission.

As mentioned above, the first compound having a delayed fluorescent property has high quantum efficiency. However, since the first compound has wide FWHM, the first compound has a disadvantage in a color purity. On other hand, the second compound having a fluorescent property has narrow FWHM. However, the triplet exciton of the second compound is not involved in the emission, the second compound has a disadvantage in an emitting efficiency.

However, in the OLED D1 of the present disclosure, the singlet energy level of the first compound as the delayed fluorescent material is transferred into the second compound as the fluorescent dopant, and the emission is generated from the second compound. Accordingly, the emitting efficiency and the color purity of the OLED D1 are improved. In addition, since the first compound of Formulas 1 to 3 and the second compound of Formulas 4 and 5 are included in the EML 240, the emitting efficiency and the color purity of the OLED D1 are further improved.

[OLED]

An anode (ITO, 50 nm), an HIL (HAT-CN (Formula 6-1) 7 nm), an HTL (NPB (Formula 6-2), 78 nm), an EBL (TAPC (Formula 6-3), 15 nm), an EML (35 nm), an HBL (B3PYMPM (Formula 6-4), 10 nm), an ETL (TPBi (Formula 6-5), 25 nm), an EIL (LiF) and a cathode are sequentially deposited to form an OLED.

(1) Comparative Example 1 (Ref1)

A host (m-CBP (Formula 6-6), 64 wt %), a compound of Formula 7-1 (35 wt %) and the compound 2-6 of Formula 5 (1 wt %) are used to form the EML.

(2) Comparative Example 2 (Ref2)

A host (m-CBP (Formula 6-6), 64 wt %), a compound of Formula 7-2 (35 wt %) and the compound 2-6 of Formula 5 (1 wt %) are used to form the EML.

(3) Comparative Example 3 (Ref3)

A host (m-CBP (Formula 6-6), 64 wt %), a compound of Formula 7-3 (35 wt %) and the compound 2-6 of Formula 5 (1 wt %) are used to form the EML.

(4) Example 1 (Ex1)

A host (m-CBP (Formula 6-6), 64 wt %), the compound 1-3 of Formula 3 (35 wt %) and the compound 2-6 of Formula 5 (1 wt %) are used to form the EML.

(5) Example 2 (Ex2)

A host (m-CBP (Formula 6-6), 64 wt %), the compound 1-2 of Formula 3 (35 wt %) and the compound 2-6 of Formula 5 (1 wt %) are used to form the EML.

(6) Example 3 (Ex3)

A host (m-CBP (Formula 6-6), 64 wt %), the compound 1-4 of Formula 3 (35 wt %) and the compound 2-6 of Formula 5 (1 wt %) are used to form the EML.

[Formula 6-1]

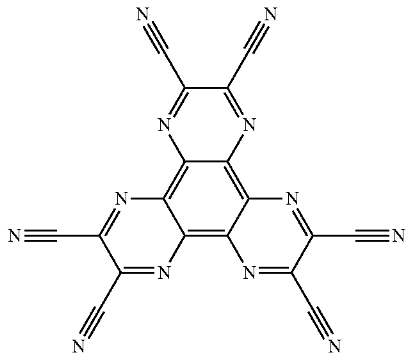

[Formula 6-2]

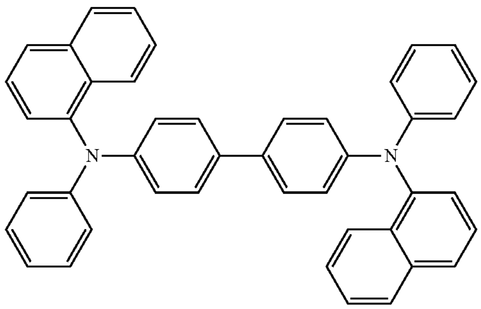

[Formula 6-3]

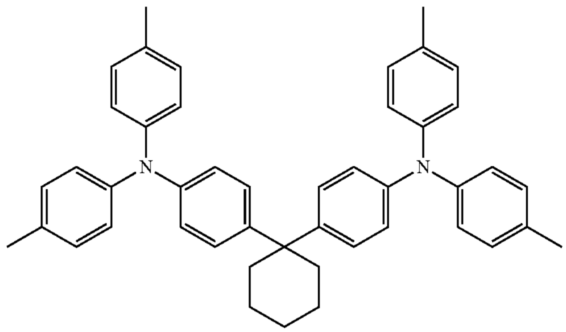

-continued

[Formula 6-4]

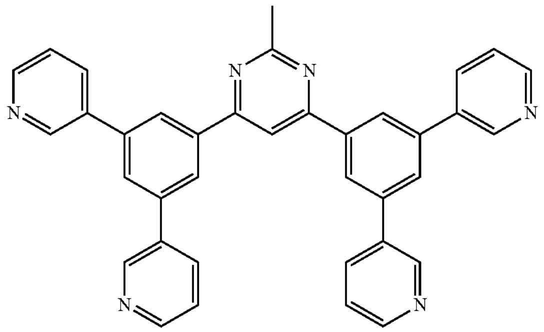

[Formula 6-5]

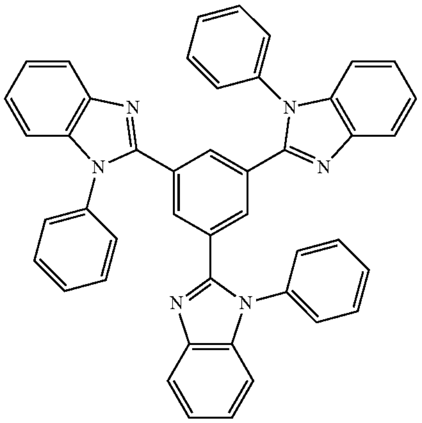

[Formula 6-6]

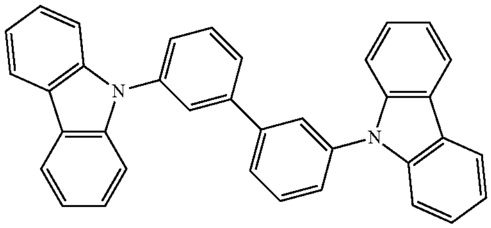

[Formula 7-1]

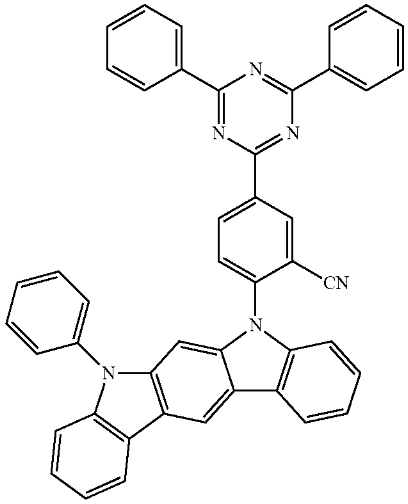

-continued

[Formula 7-2]

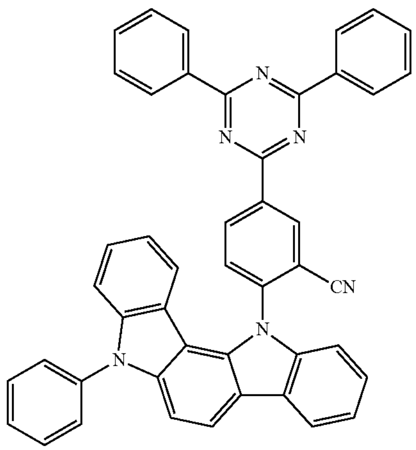

[Formula 7-3]

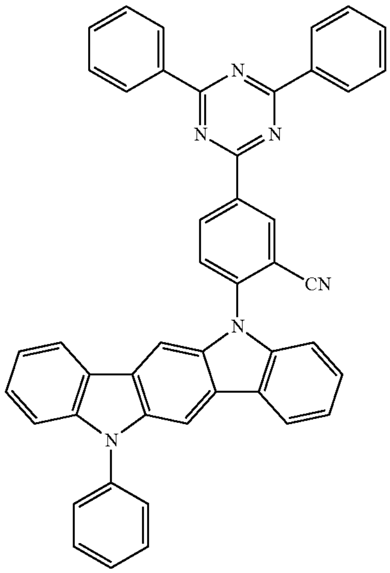

The emitting properties of the OLED in Comparative Examples 1 to 3 and Examples 1 to 3 are measured and listed in Table 1.

TABLE 1

| | V | cd/A | lm/W | EQE (%) |
|---|---|---|---|---|
| Ref1 | 3.5 | 18 | 16 | 5.8 |
| Ref2 | 3.7 | 10 | 9.6 | 5.0 |
| Ref3 | 3.7 | 8 | 2.8 | 2.2 |
| Ex1 | 4.3 | 64 | 46 | 18.5 |
| Ex2 | 4.5 | 61 | 42 | 18.0 |
| Ex3 | 4.5 | 62 | 43 | 18.1 |

As shown in Table 1, the emitting properties of the OLED in Examples 1 to 3 using the first compound of Formulas 1 to 3 and the second compound of Formulas 4 and 5 are improved.

The HOMO energy level and the LUMO energy level of the compounds 1-2, 1-3 and 1-4 of Formula 3 as the first compound of the present disclosure, the compound 2-6 of Formula 5 as the second compound of the present disclosure, the compounds of Formulas 7-1 to 7-3 are measured and listed Table 2.

TABLE 2

| compound | LUMO (eV) | HOMO (eV) |
|---|---|---|
| 2-6 | −2.8 | −5.3 |
| 1-3 | −2.8 | −5.7 |
| 1-2 | −2.9 | −5.8 |
| 1-4 | −2.9 | −5.8 |
| Formula 7-1 | −3.0 | −5.7 |
| Formula 7-2 | −3.1 | −5.7 |
| Formula 7-3 | −3.1 | −5.7 |

The LUMO energy level of the first compound of the present disclosure, i.e., the compounds 1-2, 1-3 and 1-4, is lower than that of the second compound, i.e., the compound 2-6, and a difference thereof is 0.1 eV or less. As a result, as shown in Table 1, the emitting properties of the OLED are improved. On the other hand, a difference of the LUMO energy level of each of the compounds in Formulas 7-1 to 7-3 and the LUMO energy level of the compound 2-6 is greater than 0.1 eV, and the emitting properties of the OLED including the compound 2-6 and one of the compounds in Formulas 7-1 to 7-3 are decreased.

Figure 6:
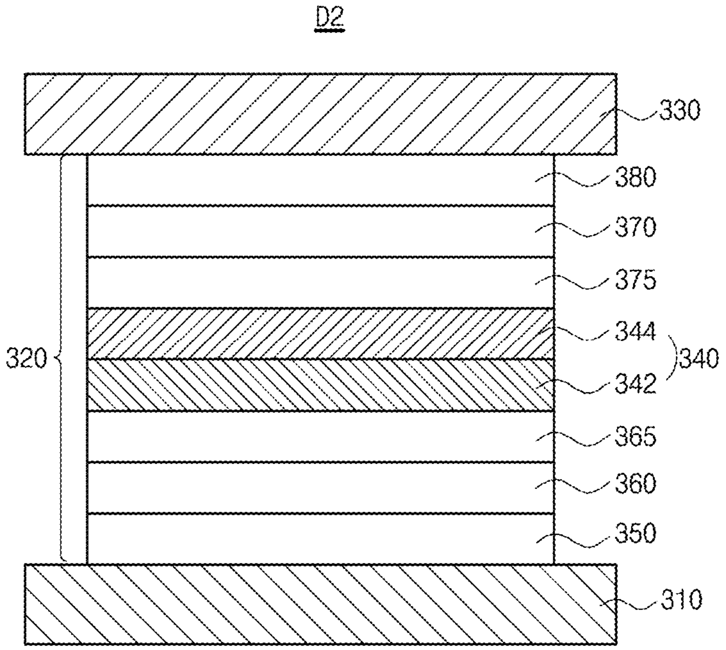
FIG. 6 is a schematic cross-sectional view of an OLED according to a third embodiment of the present disclosure.

FIG. 6 is a schematic cross-sectional view of an OLED according to a third embodiment of the present disclosure.

As shown in FIG. 6, an OLED D2 according to the third embodiment of the present disclosure includes the first and second electrodes 310 and 330, which face each other, and the light emitting layer 320 therebetween. The light emitting layer 320 includes an EML 340.

The first electrode 310 may be an anode, and the second electrode 330 may be a cathode.

The light emitting layer 320 may further includes at least one of the HTL 360 between the first electrode 310 and the EML 340 and the ETL 370 between the second electrode 330 and the EML 340.

In addition, the light emitting layer 320 may further include at least one of the HIL 350 between the first electrode 310 and the HTL 360 and the EIL 380 between the second electrode 330 and the ETL 370.

Moreover, the light emitting layer 320 may further include at least one of the EBL 365 between the HTL 360 and the EML 340 and the HBL 375 between the EML 340 and the ETL 370.

The EML 340 includes a first EML (a first layer) 342 and a second EML (a second layer) 344 sequentially stacked over the first electrode 310. Namely, the second EML 344 is positioned between the first EML 342 and the second electrode 330.

In the EML 340, one of the first and second EMLs 342 and 344 includes the first compound of the delayed fluorescent material in Formulas 1 to 3, and the other one of the first and second EMLs 342 and 344 includes the second compound of the fluorescent material in Formulas 4 and 5. In addition, the first and second EMLs 342 and 344 further include a fourth compound and a fifth compound as a host, respectively. The fourth compound in the first EML 342 and the fifth compound in the second EML 344 may be same or different. For example, each of the host of the first EML 342, i.e., the fourth compound, and the host of the second EML 344, i.e., the fifth compound, may be the above third compound.

The OLED, where the first EML 342 includes the first compound of the delayed fluorescent material, will be explained.

As mentioned above, the first compound having a delayed fluorescent property has high quantum efficiency. However, since the first compound has wide FWHM, the first compound has a disadvantage in a color purity. On other hand, the second compound having a fluorescent property has narrow FWHM. However, the triplet exciton of the second compound is not involved in the emission, the second compound has a disadvantage in an emitting efficiency.

In the OLED D2, since the triplet exciton energy of the first compound in the first EML 342 is converted into the singlet exciton energy of the first compound and the singlet exciton energy of the first compound is transferred into the singlet exciton energy of the second compound in the second EML 344 by the RISC, the second compound provides the emission. Accordingly, both the singlet exciton energy and the triplet exciton energy are involved in the emission such that the emitting efficiency is improved. In addition, since the emission is provided from the second compound of the fluorescent material, the emission having narrow FWHM is provided.

As mentioned above, the LUMO energy level of the first compound is equal to or lower than that of the second compound, and a difference between the LUMO energy level of the first compound and the LUMO energy level of the second compound is about 0.1 eV or less. As a result, the emitting efficiency of the OLED D2 is further improved.

In the first EML 342, the weight ratio of the fourth compound may be equal to or greater than that of the first compound. In the second EML 344, the weight ratio of the fifth compound may be equal to or less than that of the second compound.

In addition, a weight ratio of the first compound in the first EML 342 may be greater than that of the second compound in the second EML 344. As a result, the energy is sufficiently transferred from the first compound in the first EML 342 into the second compound in the second EML 344 by a fluorescence resonance energy transfer (FRET). For example, the first compound may have a weight % of about 1 to 50 in the first EML 342, preferably about 10 to 40, more preferably about 20 to 40. The second compound may have a weight % of about 1 to 10 in the second EML 344, preferably about 1 to 5.

When the HBL 375 is positioned between the second EML 344 and the ETL 370, the fifth compound as the host of the second EML 344 may be same as a material of the HBL 375. In this instance, the second EML 344 may have a hole blocking function with an emission function. Namely, the second EML 344 may serve as a buffer layer for blocking the hole. When the HBL 375 is omitted, the second EML 344 may serve as an emitting material layer and a hole blocking layer.

When the first EML 342 includes the second compound of the fluorescent material and the EBL 365 is positioned between the HTL 360 and the first EML 342, the host of the first EML 342 may be same as a material of the EBL 365. In this instance, the first EML 342 may have an electron blocking function with an emission function. Namely, the first EML 342 may serve as a buffer layer for blocking the electron. When the EBL 365 is omitted, the first EML 342 may serve as an emitting material layer and an electron blocking layer.

Figure 7:
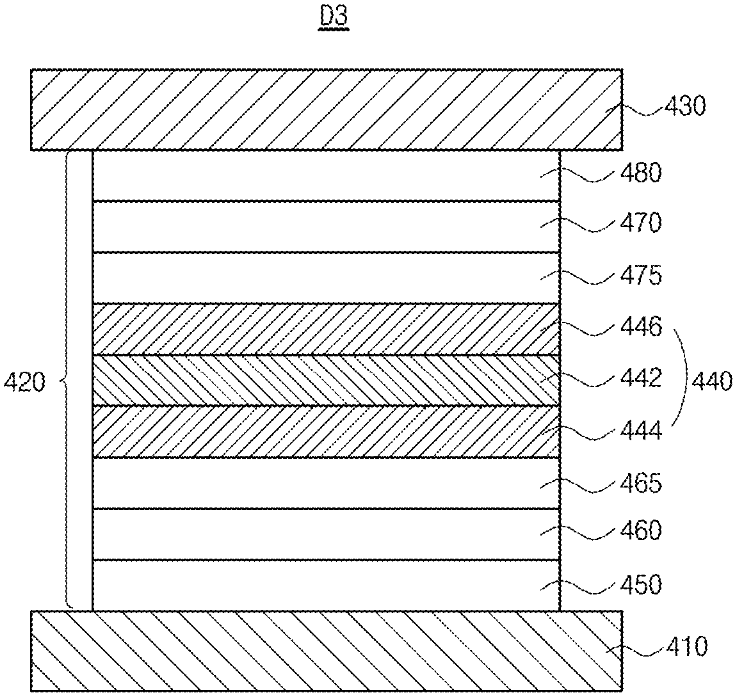
FIG. 7 is a schematic cross-sectional view of an OLED according to a fourth embodiment of the present disclosure.

FIG. 7 is a schematic cross-sectional view of an OLED according to a fourth embodiment of the present disclosure.

As shown in FIG. 7, an OLED D3 according to the fourth embodiment of the present disclosure includes the first and second electrodes 410 and 430, which face each other, and the light emitting layer 420 therebetween. The light emitting layer 420 includes an EML 440.

The first electrode 410 may be an anode, and the second electrode 430 may be a cathode.

The light emitting layer 420 may further includes at least one of the HTL 460 between the first electrode 410 and the EML 440 and the ETL 470 between the second electrode 430 and the EML 440.

In addition, the light emitting layer 420 may further include at least one of the HIL 450 between the first electrode 410 and the HTL 460 and the EIL 480 between the second electrode 430 and the ETL 470.

Moreover, the light emitting layer 420 may further include at least one of the EBL 465 between the HTL 460 and the EML 440 and the HBL 475 between the EML 440 and the ETL 470.

The EML 440 includes a first EML (a first layer) 442, a second EML (a second layer) 444 between the first EML 442 and the first electrode 410, and a third EML (a third layer) 446 between the first EML 442 and the second electrode 430. Namely, the EML 440 has a triple-layered structure of the second EML 444, the first EML 442 and the third EML 446 sequentially stacked.

For example, the first EML 442 may be positioned between the EBL 465 and the HBL 475, the second EML 444 may be positioned between the EBL 465 and the first EML 442, and the third EML 446 may be positioned between the HBL 475 and the first EML 442.

In the EML 440, the first EML 442 includes the first compound of the delayed fluorescent material in Formulas 1 to 3, and each of the second and third EMLs 444 and 446 includes the second compound of the fluorescent material in Formulas 4 and 5. The second compound in the second EML 444 and the second compound in the third EML 446 may be same or different. In addition, the first to third EMLs 442, 444 and 446 further include a sixth compound, a seventh compound and an eighth compound as a host, respectively. The sixth compound in the first EML 442, the seventh compound in the second EML 444 and the eighth compound in the third EML 446 may be same or different. For example, each of the host of the first EML 442, i.e., the sixth compound, the host of the second EML 444, i.e., the seventh compound, and the host of the third EML 446, i.e., the eighth compound may be the above third compound.

In the OLED D3, since the triplet exciton energy of the first compound in the first EML 442 is converted into the singlet exciton energy of the first compound and the singlet exciton energy of the first compound is transferred into the singlet exciton energy of the second compound in the second EML 444 and into the singlet exciton energy of the second compound in the third EML 446 by the RISC, the second compound in the second and third EMLs 444 and 446 provides the emission. Accordingly, both the singlet exciton energy and the triplet exciton energy are involved in the emission such that the emitting efficiency is improved. In addition, since the emission is provided from the second compound of the fluorescent material, the emission having narrow FWHM is provided.

As mentioned above, the LUMO energy level of the first compound is equal to or lower than that of the second compound, and a difference between the LUMO energy level of the first compound the LUMO energy level of the second compound is about 0.1 eV or less. As a result, the emitting efficiency of the OLED D3 is further improved.

In the first EML 442, the weight ratio of the sixth compound may be equal to or greater than that of the first compound. In the second EML 444, the weight ratio of the seventh compound may be equal to or less than that of the second compound. In the third EML 446, the weight ratio of the eighth compound may be equal to or less than that of the second compound.

In addition, a weight ratio of the first compound in the first EML 442 may be greater than each of that of the second compound in the second EML 444 and that of the second compound in the third EML 446. As a result, the energy is sufficiently transferred from the first compound in the first EML 442 into the second compound in the second EML 444 and the second compound in the third EML 446 by a fluorescence resonance energy transfer (FRET). For example, the first compound may have a weight % of about 1 to 50 in the first EML 442, preferably about 10 to 40, more preferably about 20 to 40. The second compound may have a weight % of about 1 to 10 in each of the second EML 444 and the third EML 446, preferably about 1 to 5.

The seventh compound as the host of the second EML 444 may be same as a material of the EBL 465. In this instance, the second EML 444 may have an electron blocking function with an emission function. Namely, the second EML 444 may serve as a buffer layer for blocking the electron. When the EBL 465 is omitted, the second EML 444 may serve as an emitting layer and an electron blocking layer.

The eighth compound as the host of the third EML 446 may be same as a material of the HBL 475. In this instance, the third EML 446 may have a hole blocking function with an emission function. Namely, the third EML 446 may serve as a buffer layer for blocking the hole. When the HBL 475 is omitted, the third EML 446 may serve as an emitting layer and a hole blocking layer.

The seventh compound in the second EML 444 may be same as a material of the EBL 465, and the eighth compound in the third EML 446 may be same as a material of the HBL 475. In this instance, the second EML 444 may have an electron blocking function with an emission function, and the third EML 446 may have a hole blocking function with an emission function. Namely, the second EML 444 may serve as a buffer layer for blocking the electron, and the third EML 446 may serve as a buffer layer for blocking the hole. When the EBL 465 and the HBL 475 are omitted, the second EML 444 may serve as an emitting material layer and an electron blocking layer and the third EML 446 serves as an emitting material layer and a hole blocking layer.

It will be apparent to those skilled in the art that various modifications and variations can be made in the present invention without departing from the spirit or scope of the invention. Thus, it is intended that the present disclosure cover the modifications and variations of this disclosure provided they come within the scope of the appended claims and their equivalents.

What is claimed is:

1. An organic light emitting diode, comprising:

a first electrode;

a second electrode facing the first electrode; and an emitting material layer including a first compound and a second compound and positioned between the first and second electrodes, wherein the first compound is represented by Formula 1:

[Formula 1]

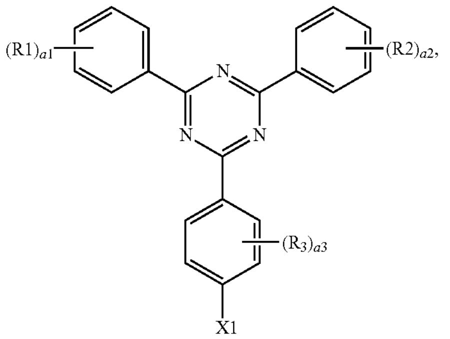

wherein each of a1 to a3 is independently an integer of 0 to 4, wherein each of R1 to R3 is independently selected from the group consisting of deuterium, tritium, a C1 to C20 alkyl, a C6 to C30 aryl and a C3 to C40 heteroaryl, or adjacent two of R1, adjacent two of R2 and/or adjacent two of R3 are combined to form a fused ring, wherein X1 is a heteroaryl including at least two of carbon (C), nitrogen (N), oxygen (O) and sulfur(S), wherein the second compound is one of a compound in Formula 5:

[Formula 5]

2-2

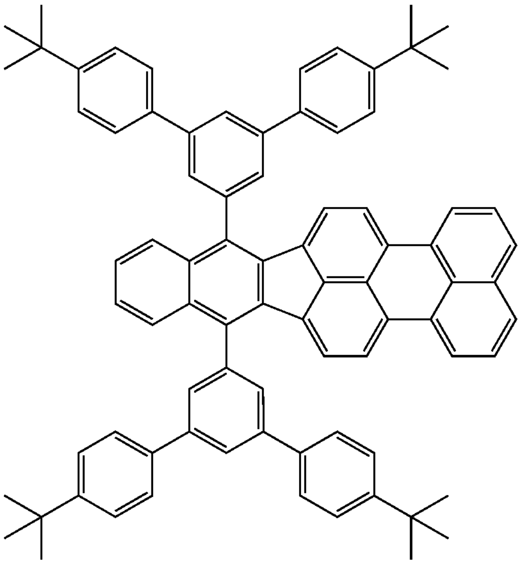

-continued 2-15

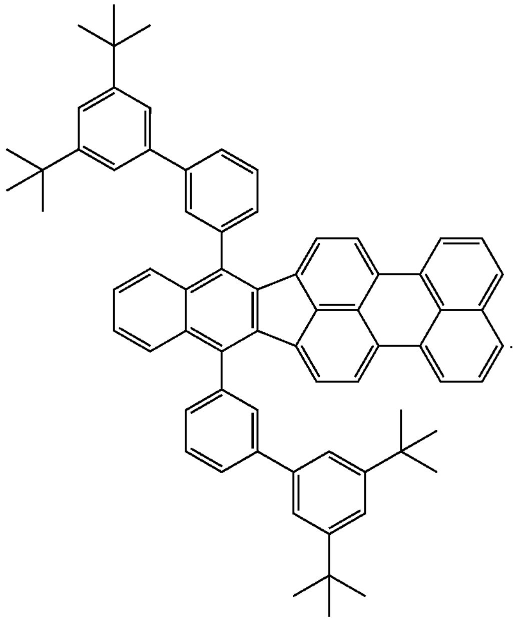

2. The organic light emitting diode according to claim 1, wherein the first compound is represented by Formula 3:

[Formula 3]

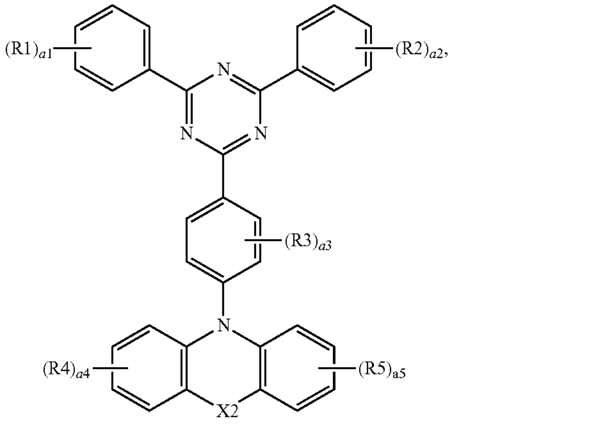

wherein each of a1 to a5 is independently an integer of 0 to 4, wherein each of R1 to R5 is independently selected from the group consisting of deuterium, tritium, a C1 to C20 alkyl, a C6 to C30 aryl and a C3 to C40 heteroaryl, or adjacent two of R1, adjacent two of R2, adjacent two of R3 and/or adjacent two of R4 are combined to form a fused ring, and wherein X2 is selected from a single bond, CR6R7, O and S, and each of R6 and R7 is independently selected from hydrogen, deuterium, tritium, a C1 to C20 alkyl and a C6 to C30 aryl.

3. The organic light emitting diode according to claim 1, wherein an energy level of a lowest unoccupied molecular orbital (LUMO) of the first compound is equal to or lower than an energy level of a LUMO of the second compound, and a difference between the energy level of the LUMO of the first compound and the energy level of the LUMO of the second compound is about 0.1 eV or less.

4. The organic light emitting diode according to claim 1, wherein an energy band gap of the first compound is about 2.0 to 3.0 eV, and wherein the energy band gap of the first compound is a difference between an energy level of a highest occupied molecular orbital (HOMO) of the first compound and an energy level of a lowest unoccupied molecular orbital (LUMO) of the first compound.

5. The organic light emitting diode according to claim 1, wherein the first compound is one of a compound in Formula 4:

[Formula 4]

1-1

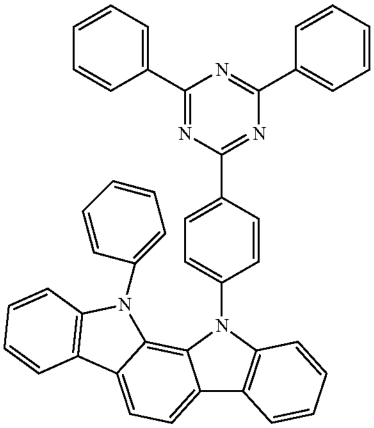

1-2

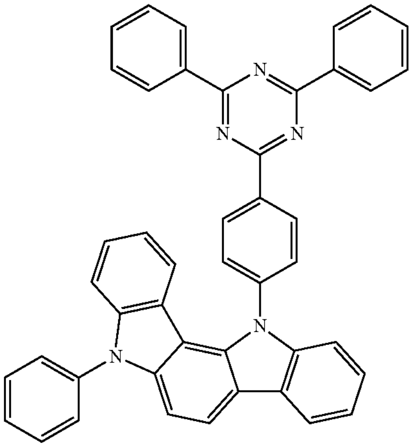

-continued 1-3

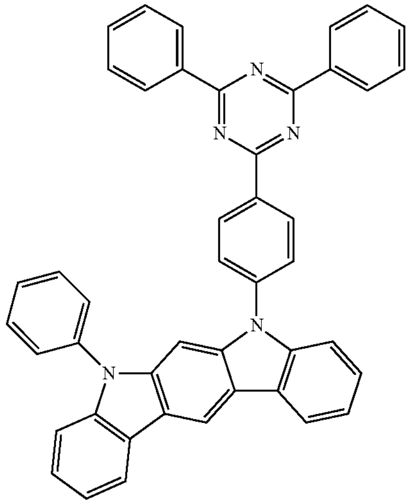

1-4

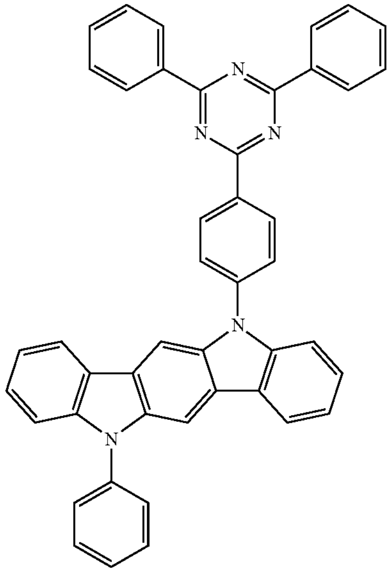

1-5

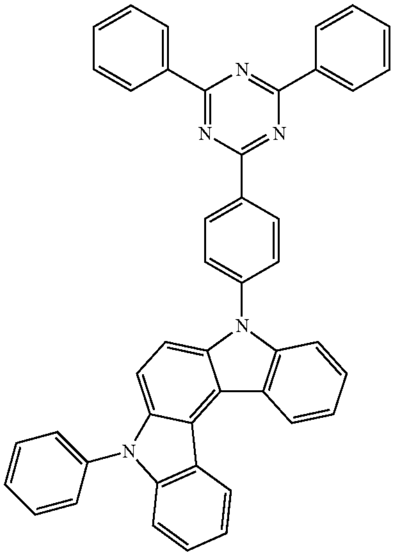

-continued
1-6
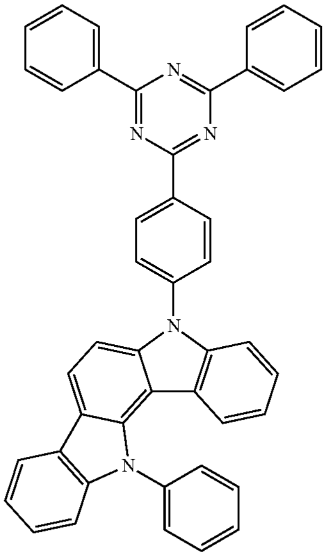
1-7
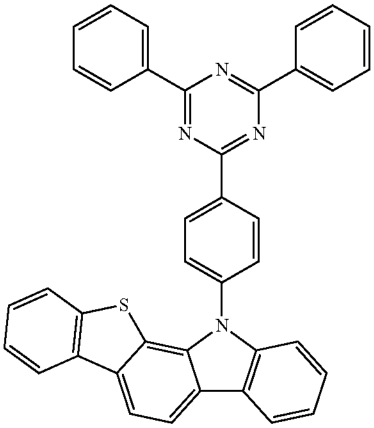
1-8
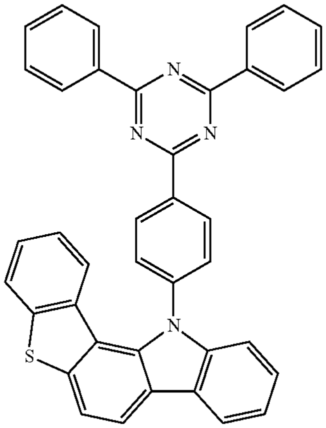
-continued
1-9
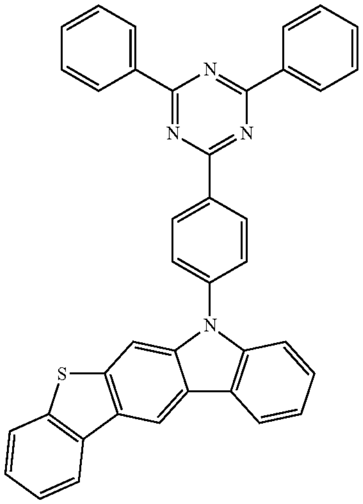
1-10
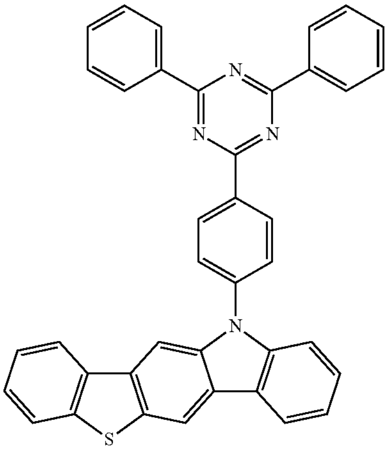
1-11
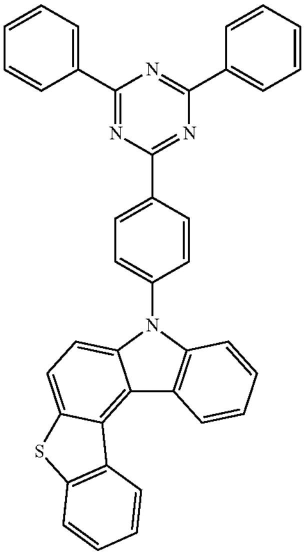

-continued
1-12
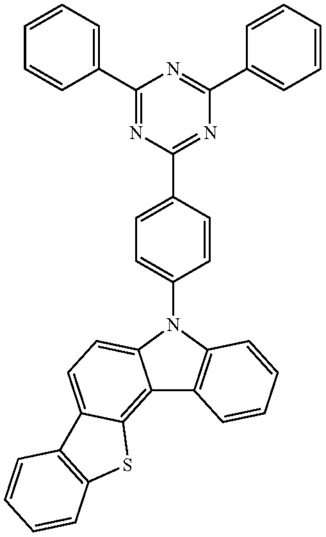
1-13
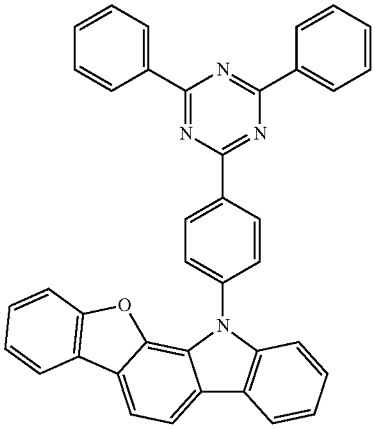
1-14
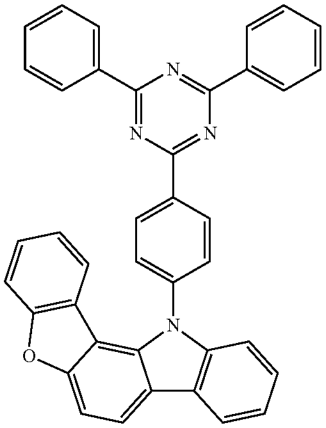
-continued
1-15
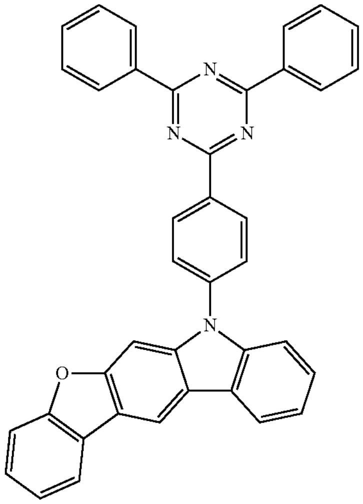
1-16
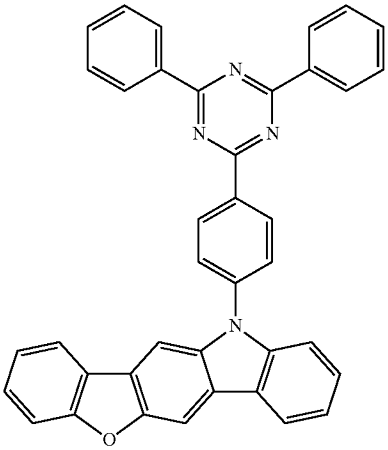
1-17
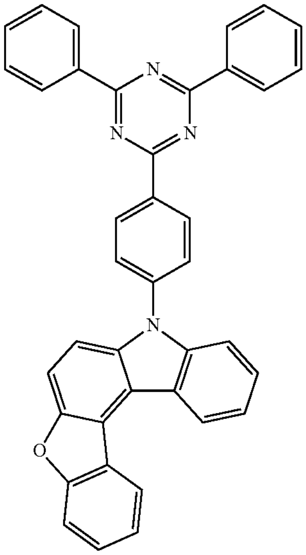

-continued
1-18
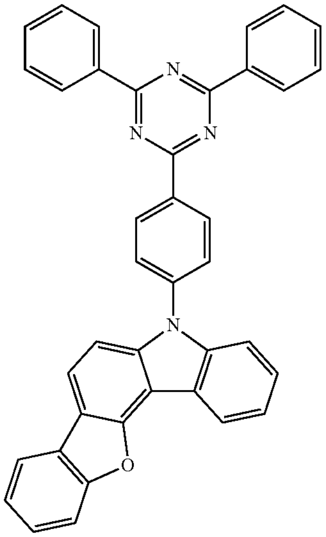
1-19
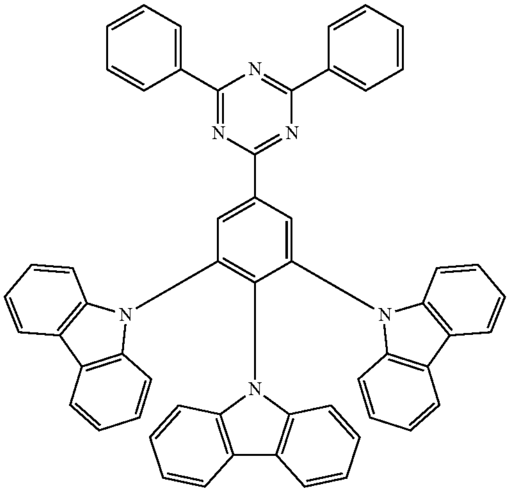
1-20
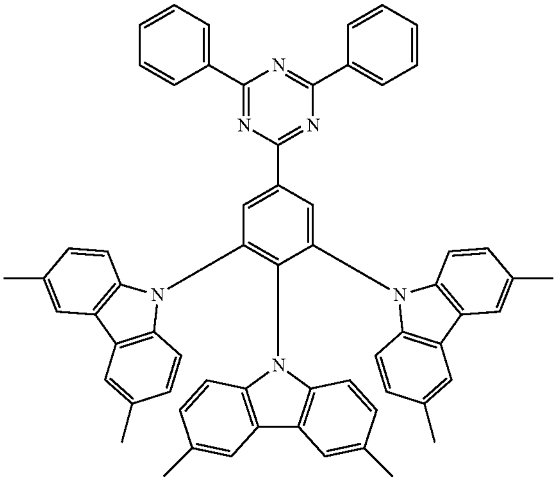
-continued
1-21
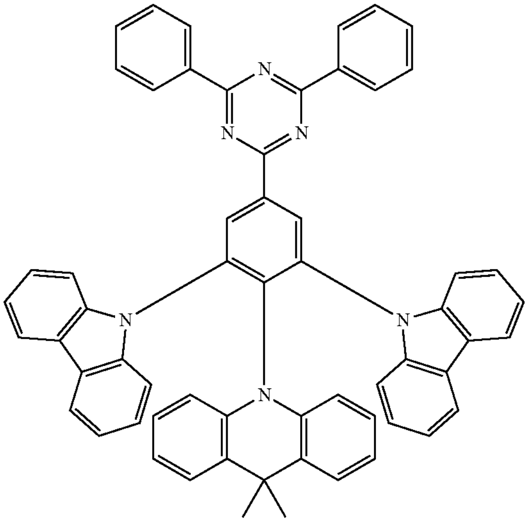
1-22
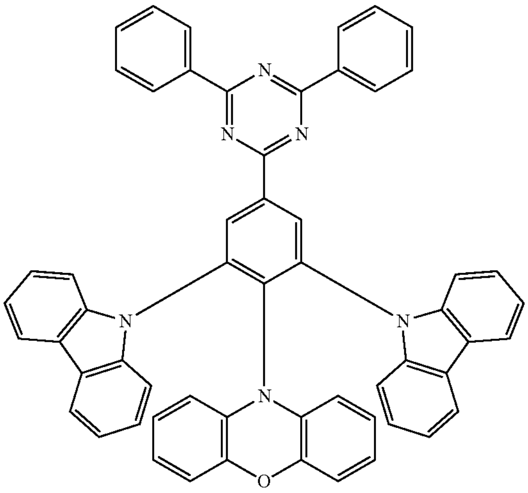
1-23
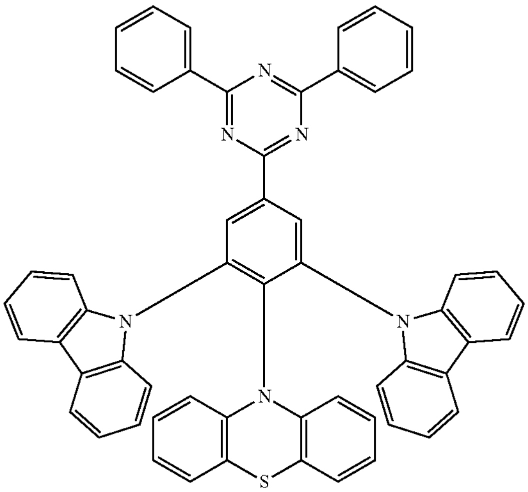

-continued
1-24
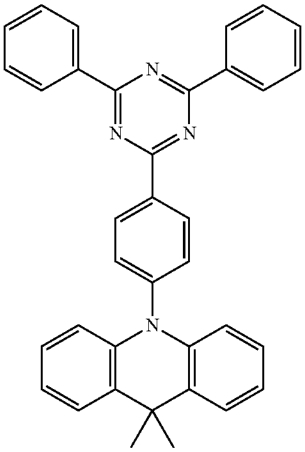
1-25
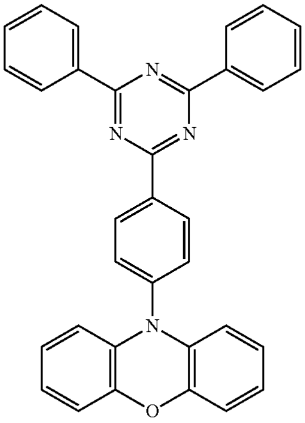
1-26
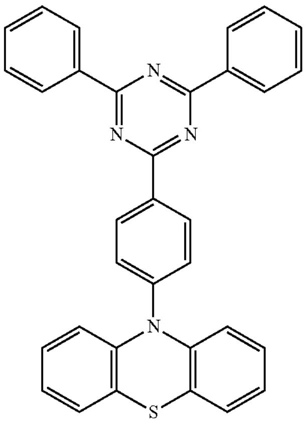
6. The organic light emitting diode according to claim 1, wherein a weight % of the first compound is greater than that of the second compound.
7. The organic light emitting diode according to claim 1, wherein the first compound is one of a compound in Formula 4-1:
[Formula 4-1]
1-7
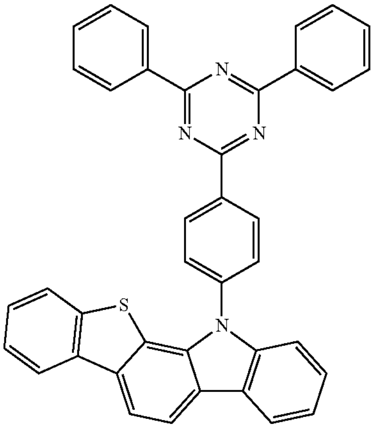
1-8
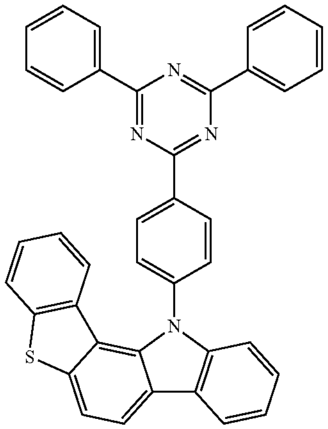
1-9
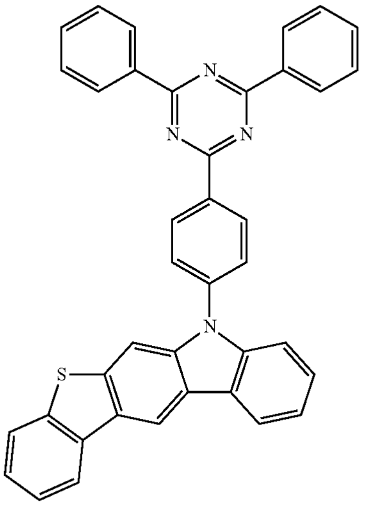

-continued
1-10
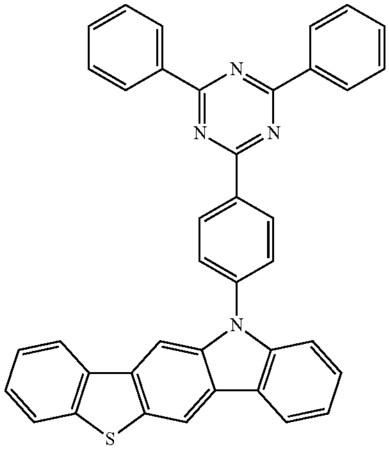
1-11
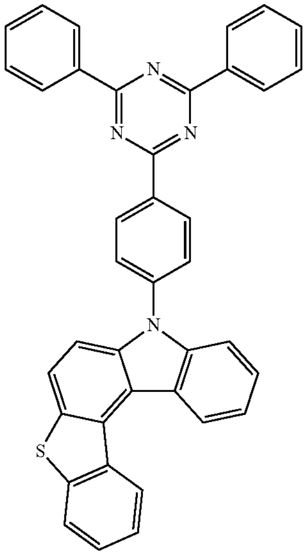
1-12
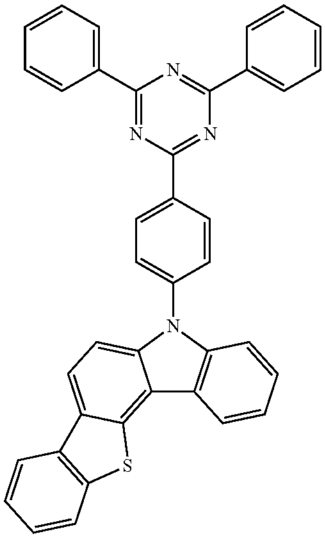
-continued
1-13
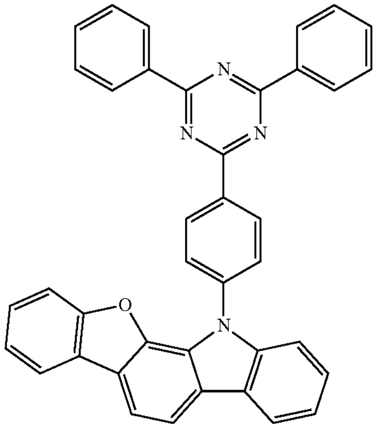
1-14
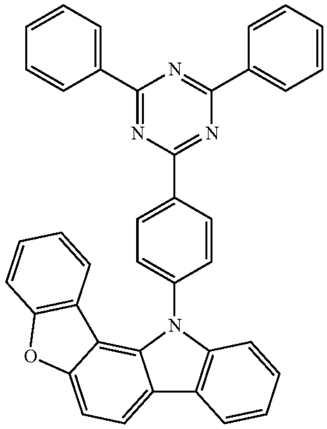
1-15
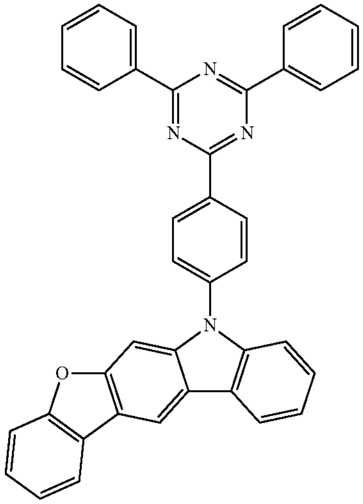

-continued
1-16
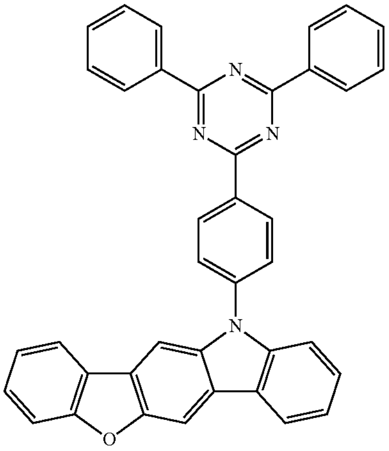
1-17
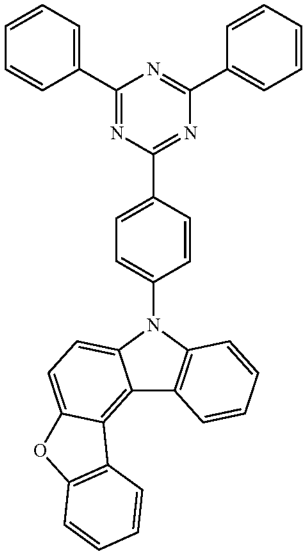
1-18
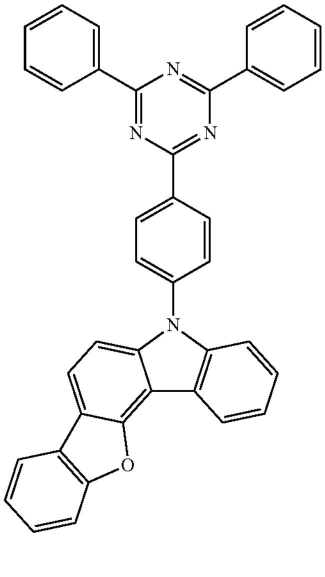
-continued
1-19
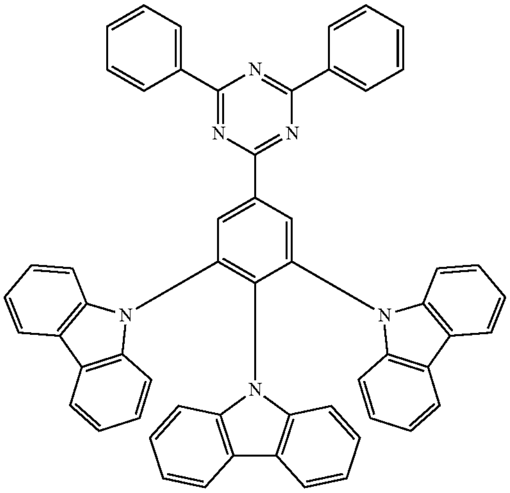
1-20
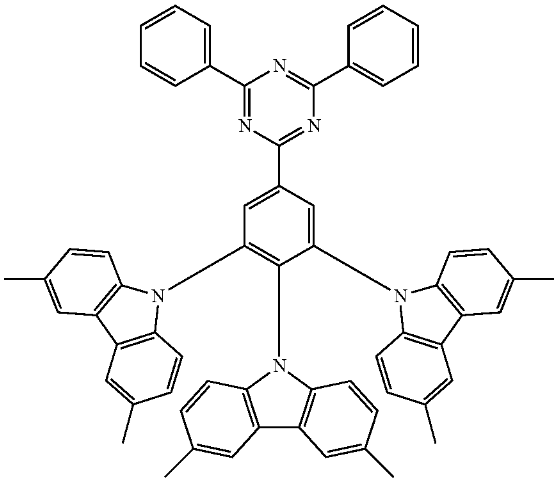
1-21
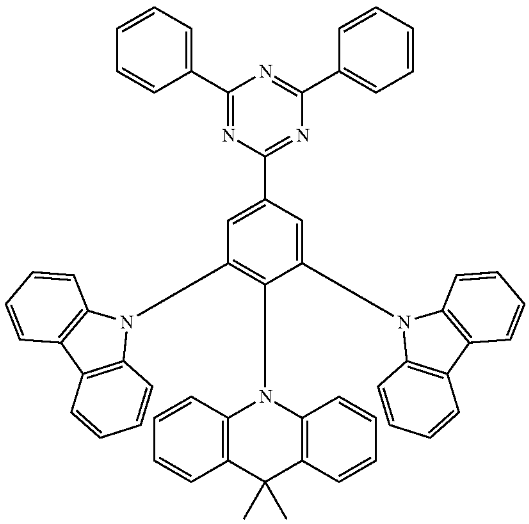

-continued 1-22

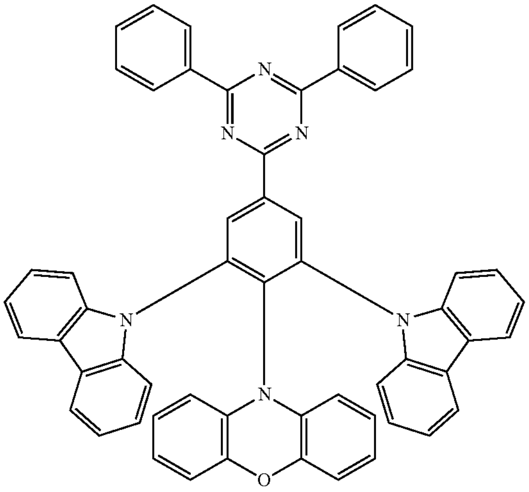

1-23

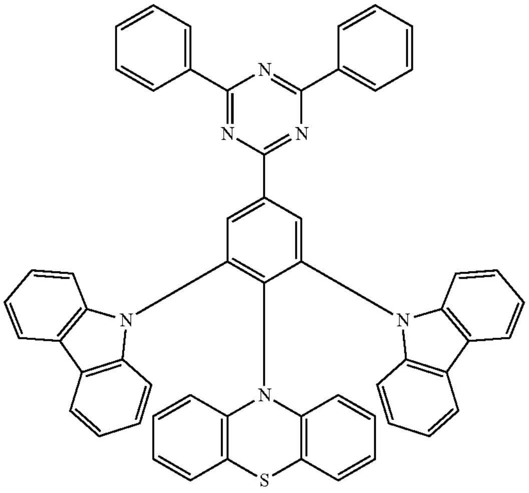

1-24

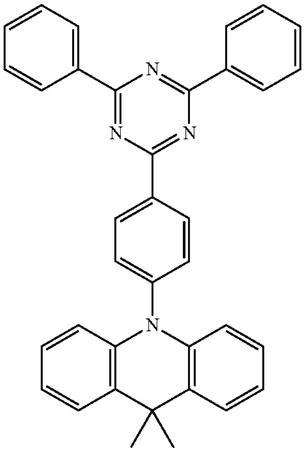

-continued 1-25

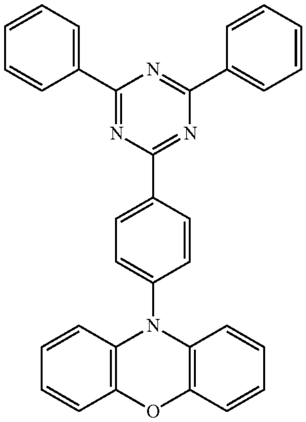

1-26

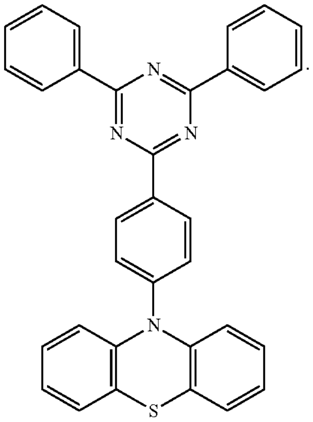

8. The organic light emitting diode according to claim 1, wherein the emitting material layer includes a first emitting material layer and a second emitting material layer, and the second emitting material layer is positioned between the first emitting material layer and the first electrode, wherein the first compound is included in the first emitting material layer, and the second compound is included in the second emitting material layer, and wherein the first emitting material layer contacts the second emitting material layer.

9. The organic light emitting diode according to claim 8, wherein the first compound is represented by Formula 3:

[Formula 3]

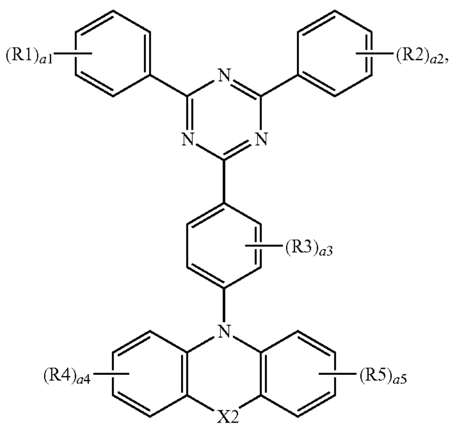

wherein each of a1 to a5 is independently an integer of 0 to 4, wherein each of R1 to R5 is independently selected from the group consisting of deuterium, tritium, a C1 to C20 alkyl, a C6 to C30 aryl and a C3 to C40 heteroaryl, or adjacent two of R1, adjacent two of R2, adjacent two of R3 and/or adjacent two of R4 are combined to form a fused ring, and wherein X2 is selected from a single bond, CR6R7, O and S, and each of R6 and R7 is independently selected from hydrogen, deuterium, tritium, a C1 to C20 alkyl and a C6 to C30 aryl.

10. The organic light emitting diode according to claim 8, wherein an energy level of a lowest unoccupied molecular orbital (LUMO) of the first compound is equal to or lower than an energy level of a LUMO of the second compound, and a difference between the energy level of the LUMO of the first compound and the energy level of the LUMO of the second compound is about 0.1 eV or less.

11. The organic light emitting diode according to claim 8, wherein an energy band gap of the first compound is about 2.0 to 3.0 eV, and wherein the energy band gap of the first compound is a difference between an energy level of a highest occupied molecular orbital (HOMO) of the first compound and an energy level of a lowest unoccupied molecular orbital (LUMO) of the first compound.

12. The organic light emitting diode according to claim 8, wherein the first compound is one of a compound in Formula 4:

[Formula 3]

1-1

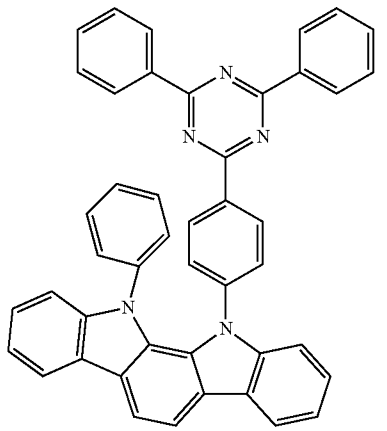

1-2

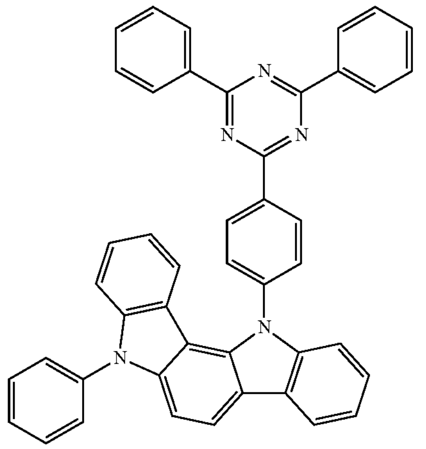

1-3

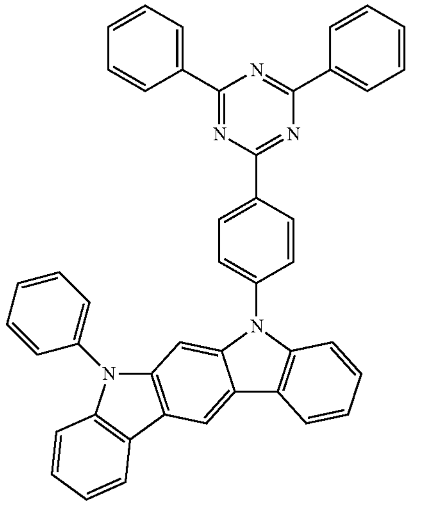

-continued
1-4
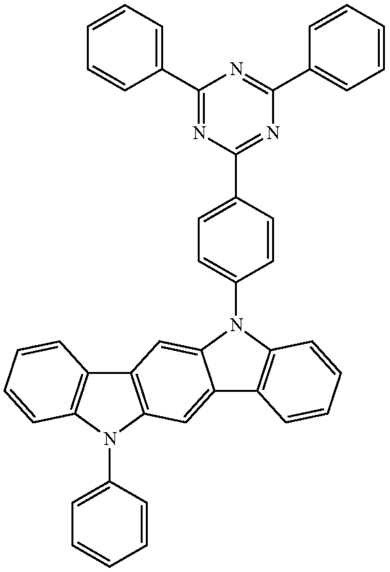
1-5
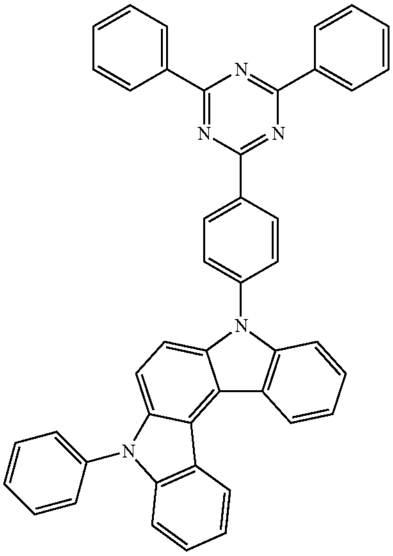
-continued
1-6
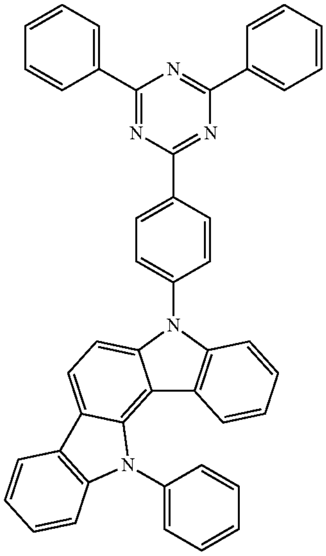
1-7
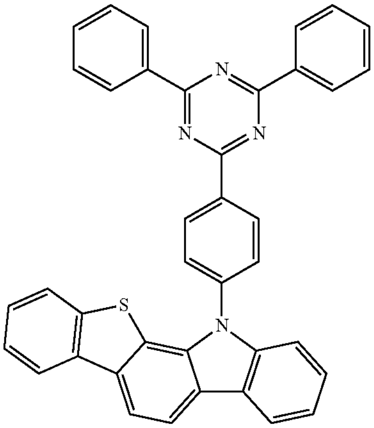
1-8
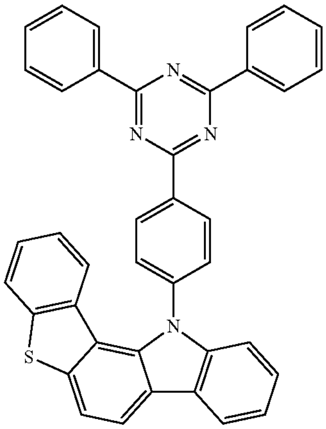

-continued
1-9
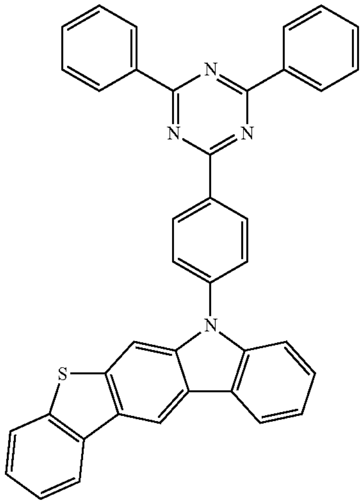
1-10
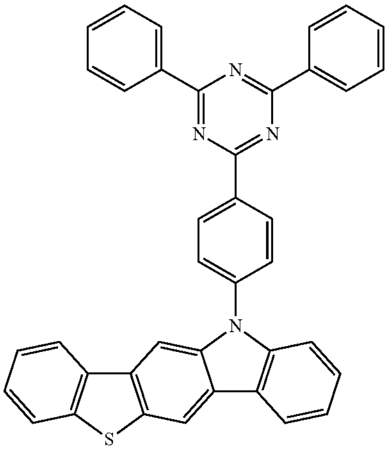
1-11
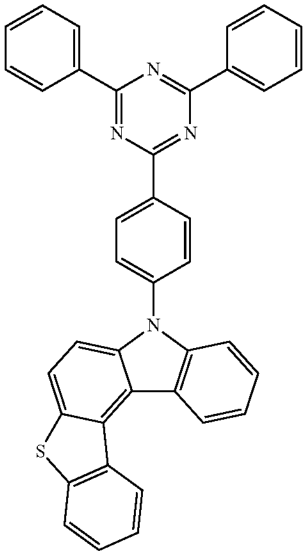
-continued
1-12
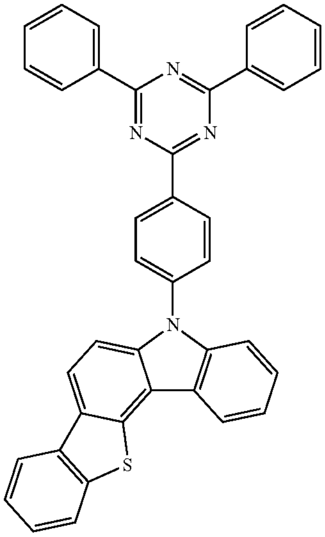
1-13
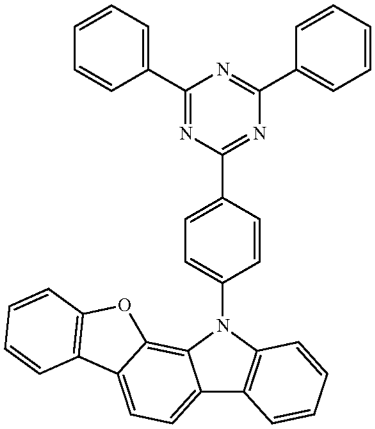
1-14
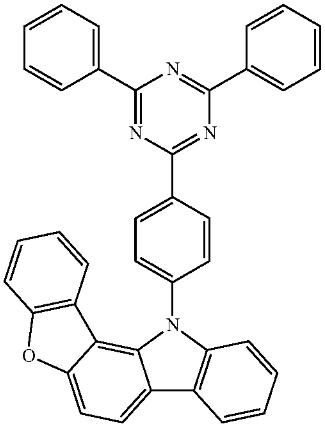

-continued
1-15
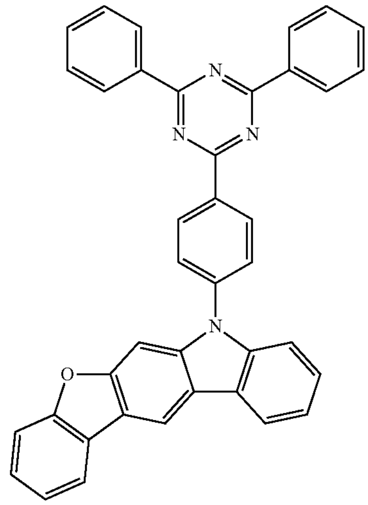
1-16
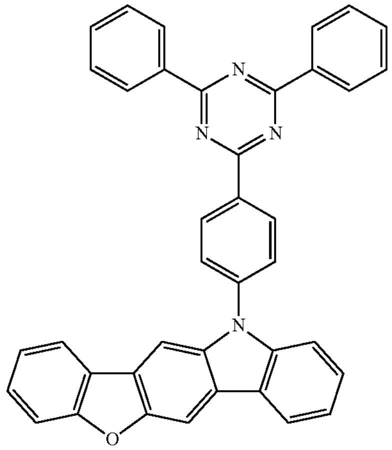
1-17
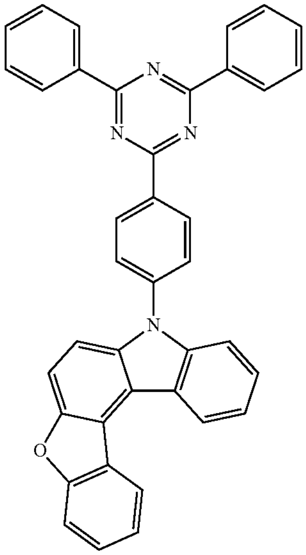
-continued
1-18
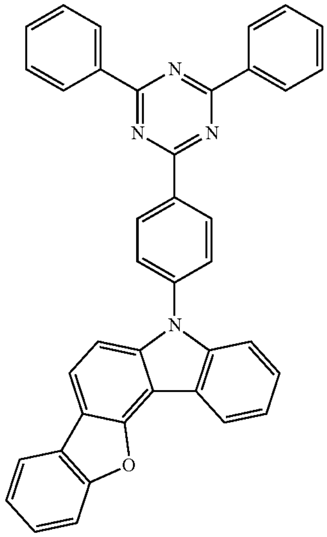
1-19
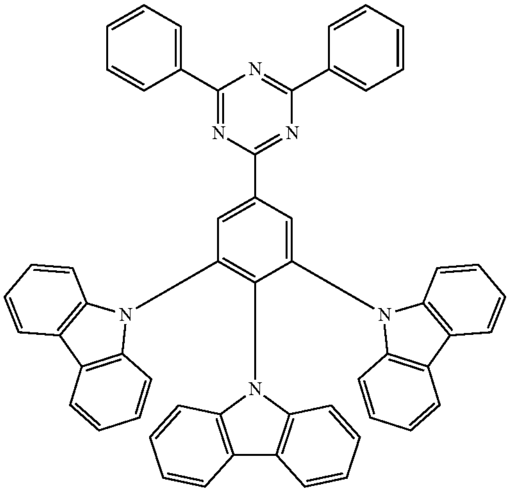
1-20
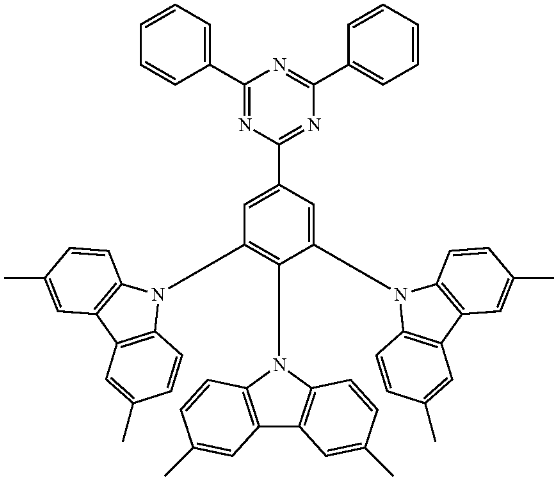

-continued 1-21

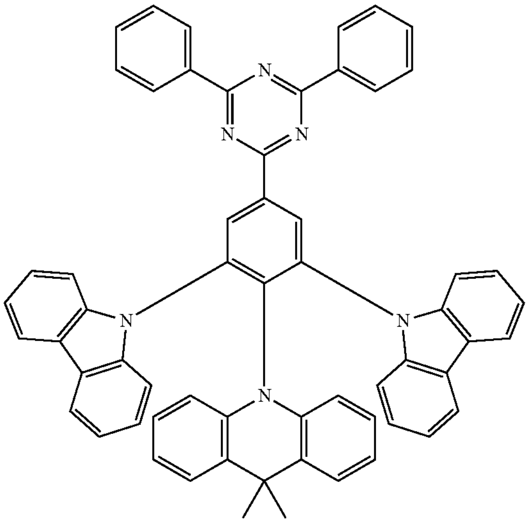

1-22

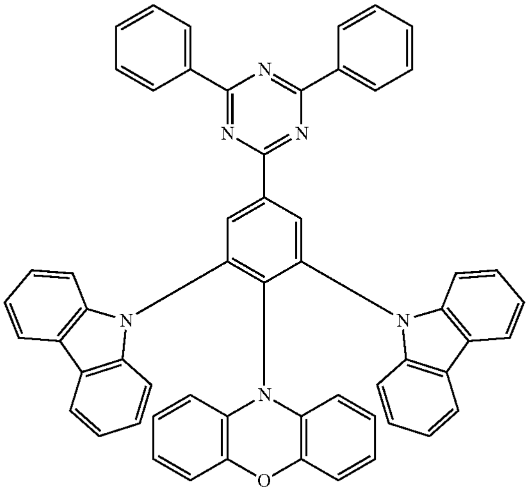

1-23

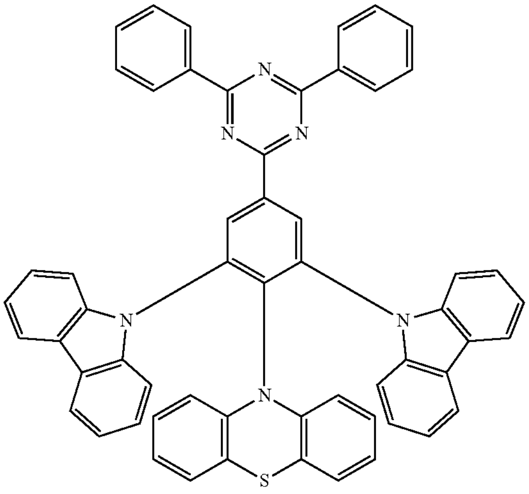

-continued 1-24

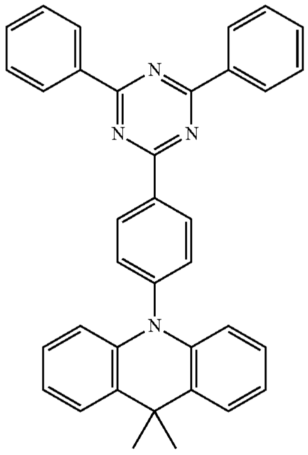

1-25

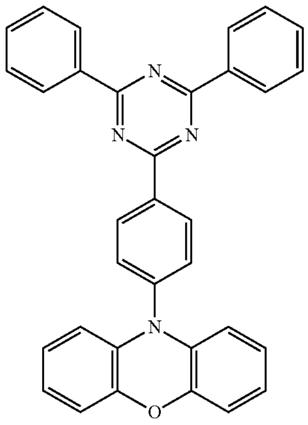

1-26

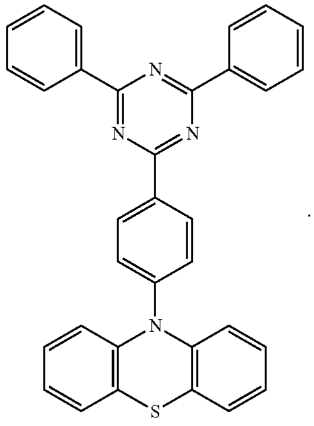

13. The organic light emitting diode according to claim 8, wherein a weight % of the first compound in the first emitting material layer is greater than that of the second compound in the second emitting material layer.

14. The organic light emitting diode according to claim 8, wherein the emitting material layer further includes a third emitting material layer including the second compound and positioned between the second electrode and the first emitting material layer, and wherein the third emitting material layer contacts the first emitting material layer.

* * * * *